(12) United States Patent
Yokomizo

(10) Patent No.: US 6,199,564 B1
(45) Date of Patent: Mar. 13, 2001

(54) SUBSTRATE PROCESSING METHOD AND APPARATUS

(75) Inventor: Kenji Yokomizo, Dr Round Rock, TX (US)

(73) Assignee: Tokyo Electron Limited, Tokyo-To (JP)

( * ) Notice: Subject to any disclaimer, the term of this patent is extended or adjusted under 35 U.S.C. 154(b) by 0 days.

(21) Appl. No.: 09/185,413

(22) Filed: Nov. 3, 1998

(51) Int. Cl.$^7$ ..................................................... B08B 3/04
(52) U.S. Cl. .......................... 134/78; 134/135; 134/186; 134/902
(58) Field of Search .................. 134/32, 25.4, 78, 134/135, 155, 186, 147, 902; 118/416, 425

(56) References Cited

U.S. PATENT DOCUMENTS

| | | | |
|---|---|---|---|
| 4,520,834 | * | 6/1985 | DiCicco ............................. 134/902 |
| 4,985,722 | | 1/1991 | Ushijima et al. . |
| 4,995,411 | * | 2/1991 | Lowell et al. ..................... 134/902 |
| 5,061,144 | | 10/1991 | Akimoto et al. . |
| 5,156,813 | * | 10/1992 | Calhoun ............................ 134/186 |
| 5,201,955 | * | 4/1993 | Chika et al. . |
| 5,279,794 | * | 1/1994 | Saso ................................... 134/185 |
| 5,297,910 | | 3/1994 | Yoshioka et al. . |
| 5,369,891 | * | 12/1994 | Kamikawa . |
| 5,474,616 | * | 12/1995 | Hayami et al. ........................ 134/32 |
| 5,626,159 | * | 5/1997 | Erk et al. ............................ 134/147 |
| 5,626,675 | | 5/1997 | Sakamoto . |
| 5,657,553 | * | 8/1997 | Tarui et al. . |

FOREIGN PATENT DOCUMENTS

1107909 * 8/1984 (RU) ..................................... 134/32

* cited by examiner

Primary Examiner—Frankie L. Stinson
(74) Attorney, Agent, or Firm—Morrison & Foerster

(57) ABSTRACT

A wafer processing apparatus prevents the reattachment of particles to wafers, such as semiconductor wafers, when processing the wafers by immersing the same held in a vertical attitude in a processing liquid and a cleaning liquid. When immersing the wafers processed by the processing liquid in the cleaning liquid contained in and overflowing a cleaning tank, a wafer holding device holding the wafers in a vertical attitude is stopped temporarily upon the immersion of lower parts of the wafers in the cleaning liquid. Consequently, particles contained in the processing liquid remaining on the wafers are dispersed in the overflowing cleaning liquid, so that the particles can be removed from the wafers and the reattachment of the particles to the wafers does not occur. When transferring the processed wafers to another processing tank or a cleaning tank, a clean gas is blown upward from below the wafers to suppress the down flow of the processing liquid remaining on the wafers in order that films formed on the wafers can be processed uniformly. This serves to improve the yield.

8 Claims, 19 Drawing Sheets

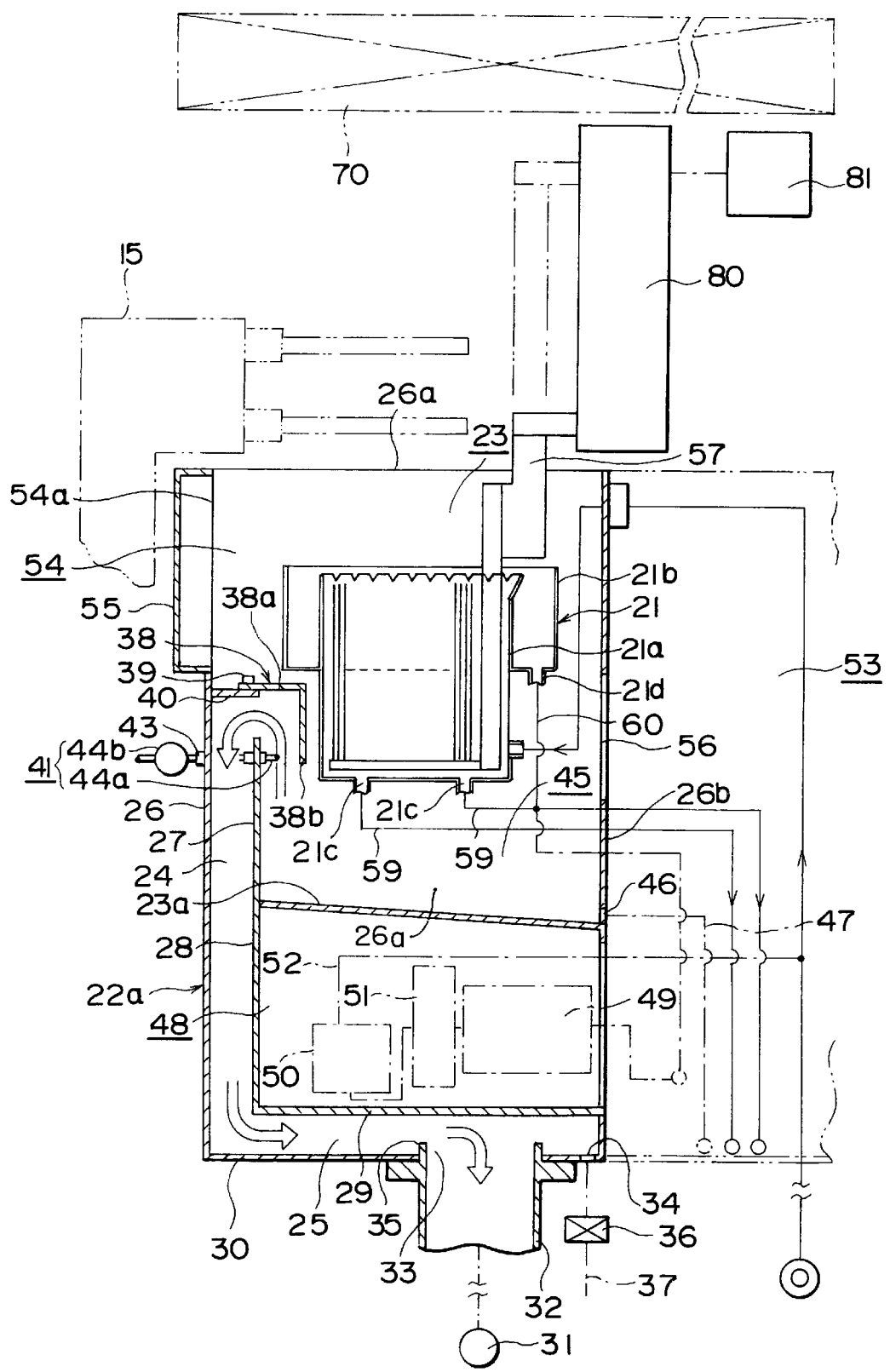
F I G. 4

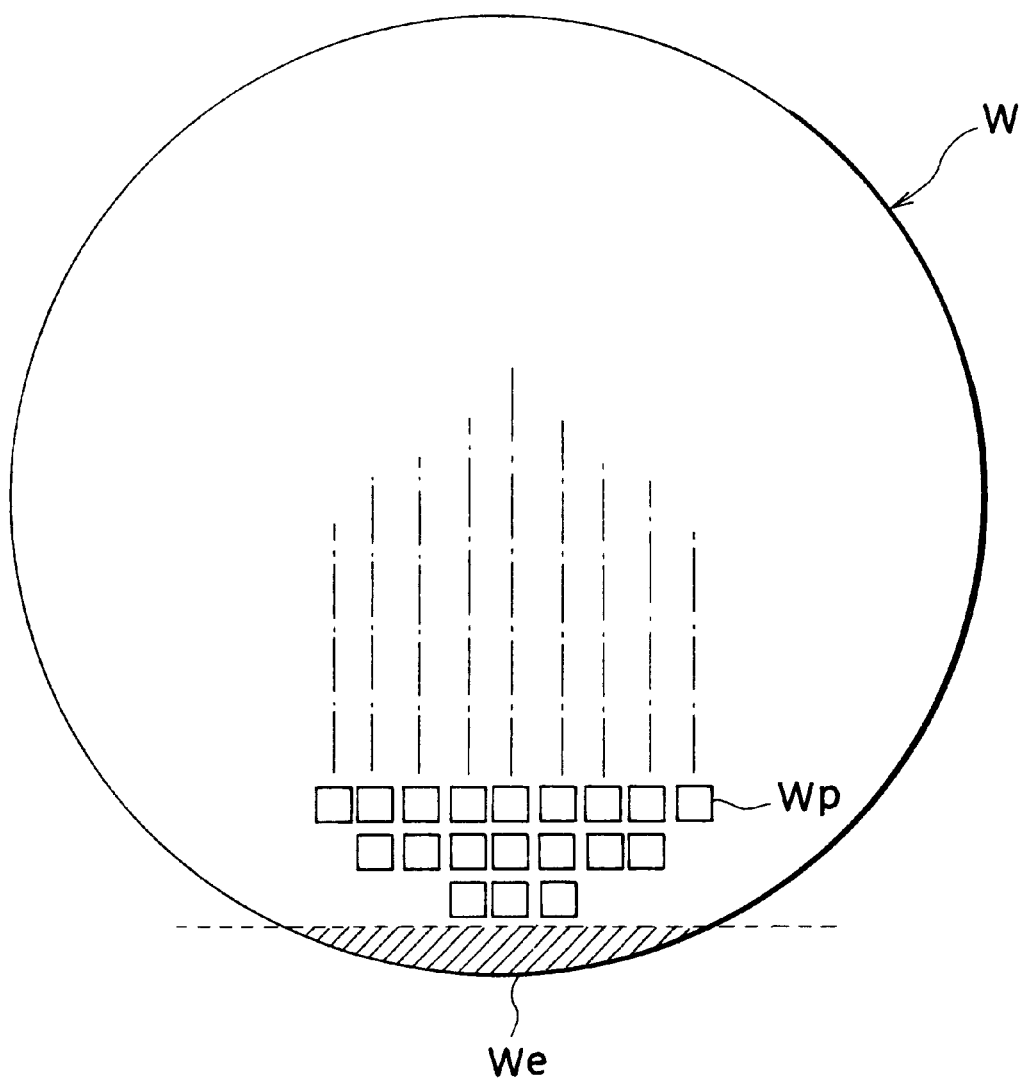
F I G. 6

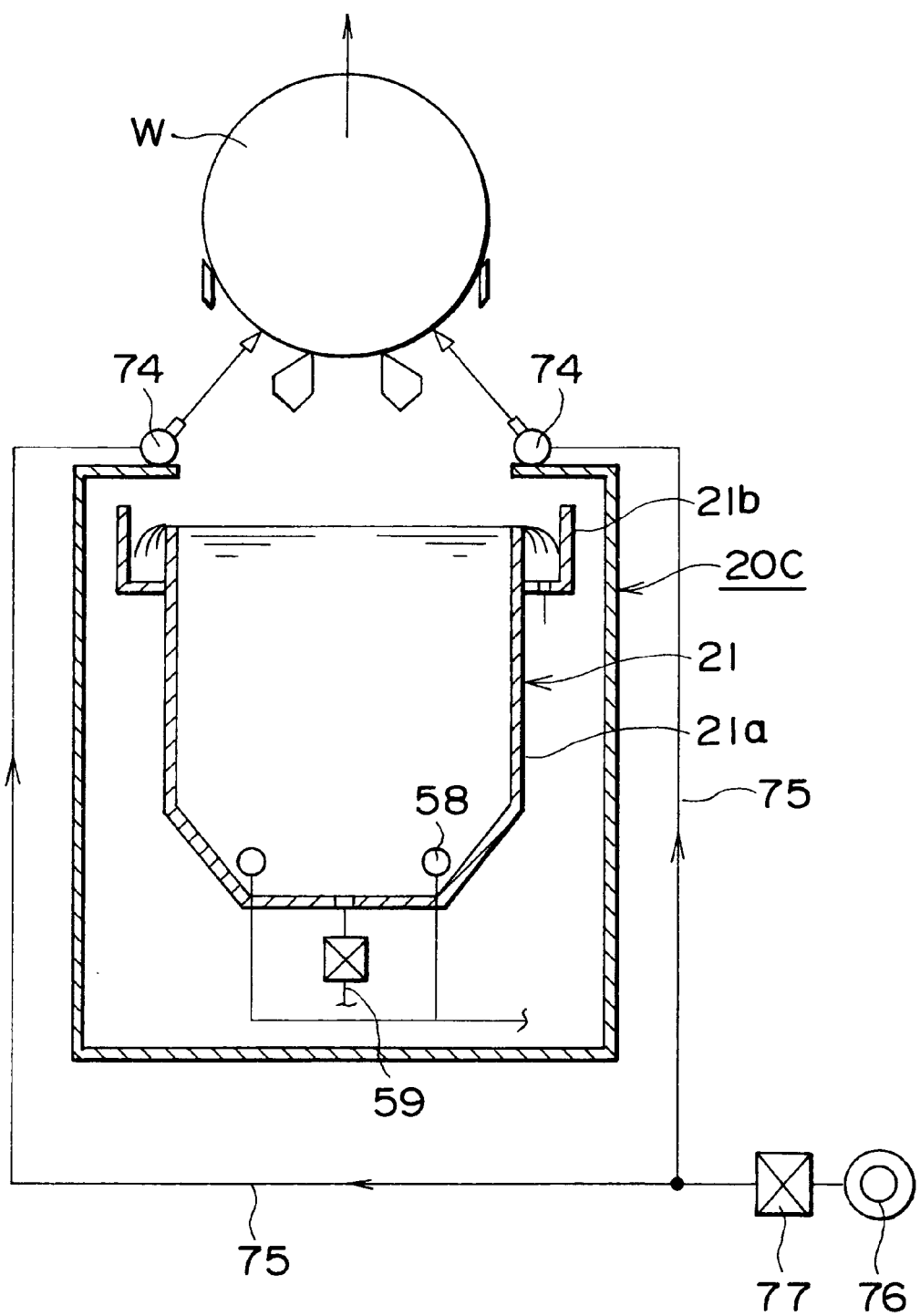
F I G. 9

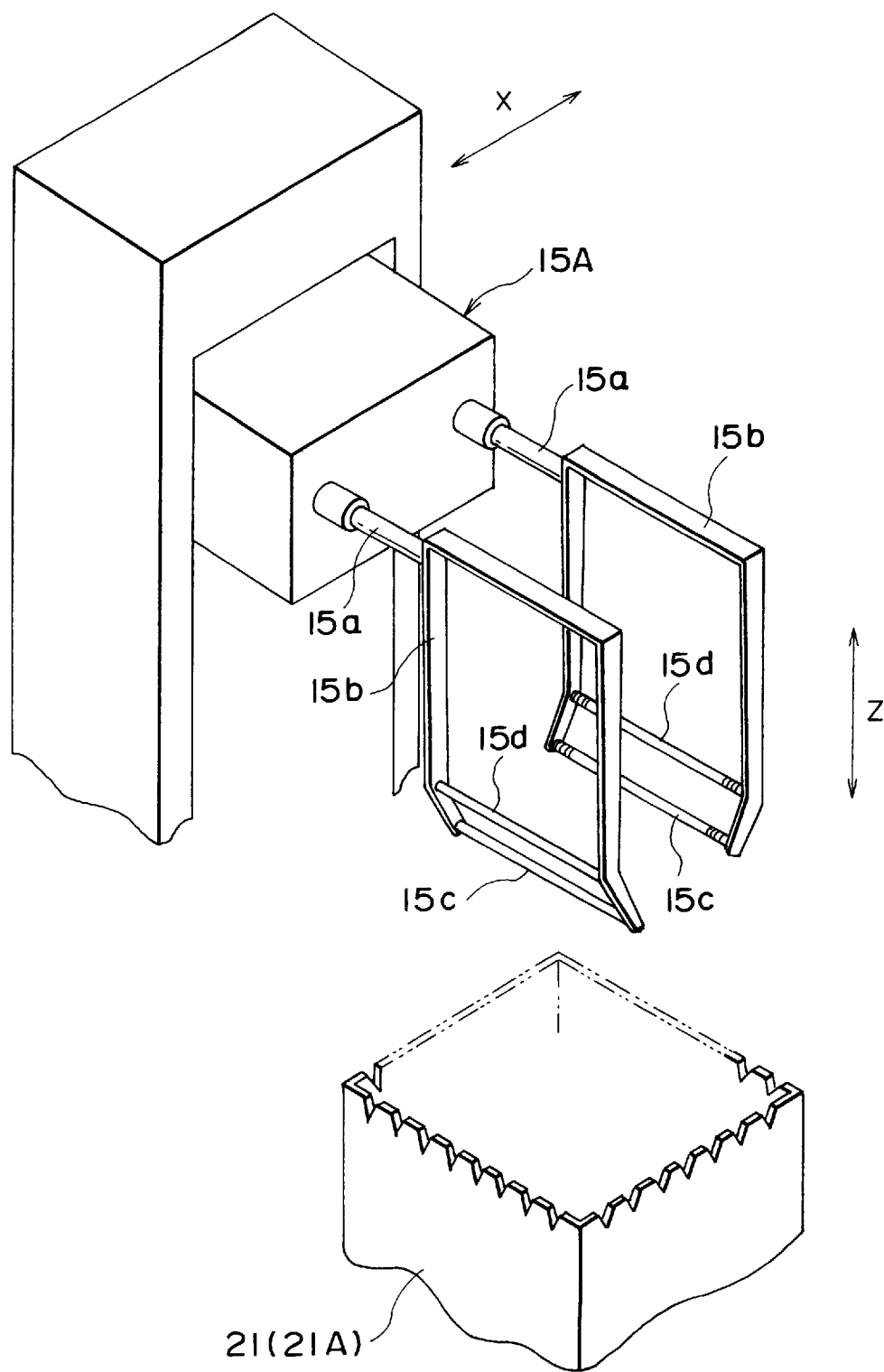
F I G. 11

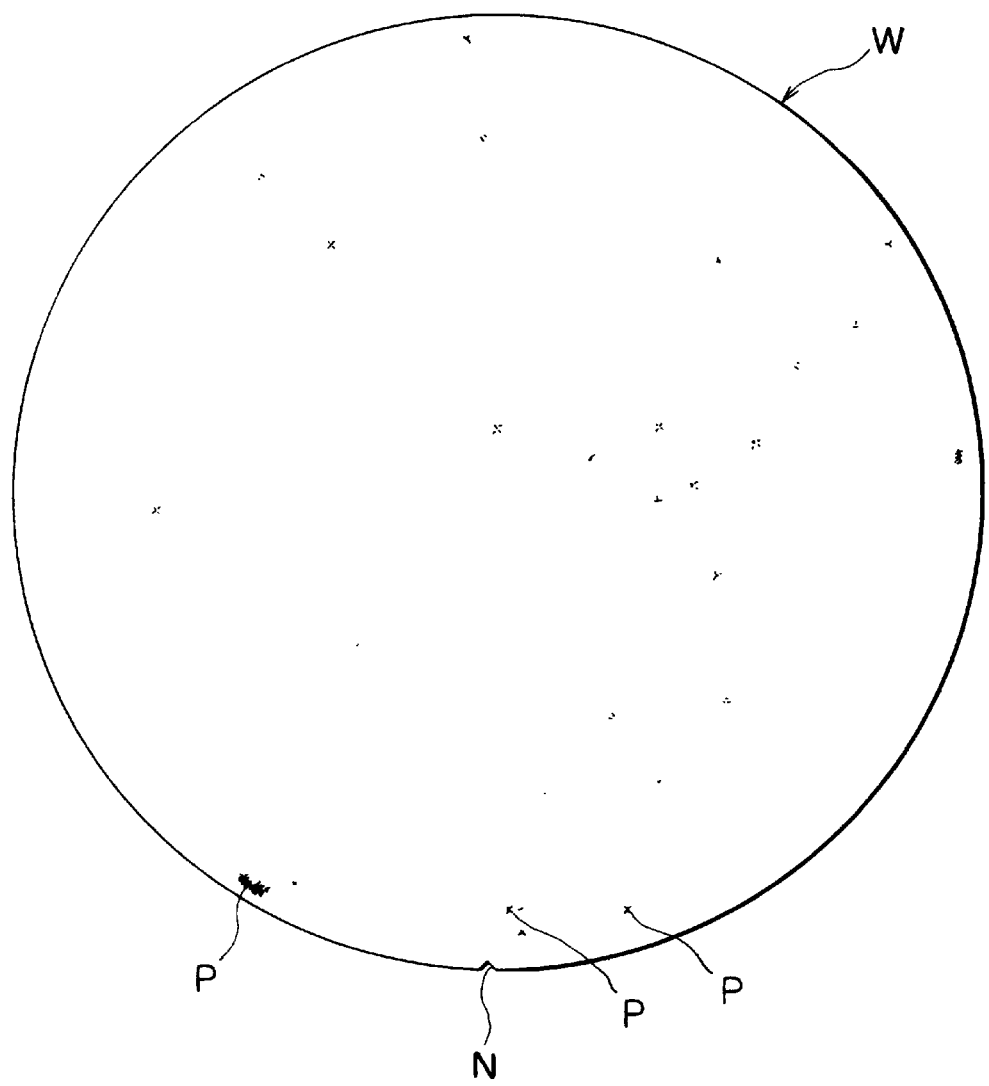
F I G. 13

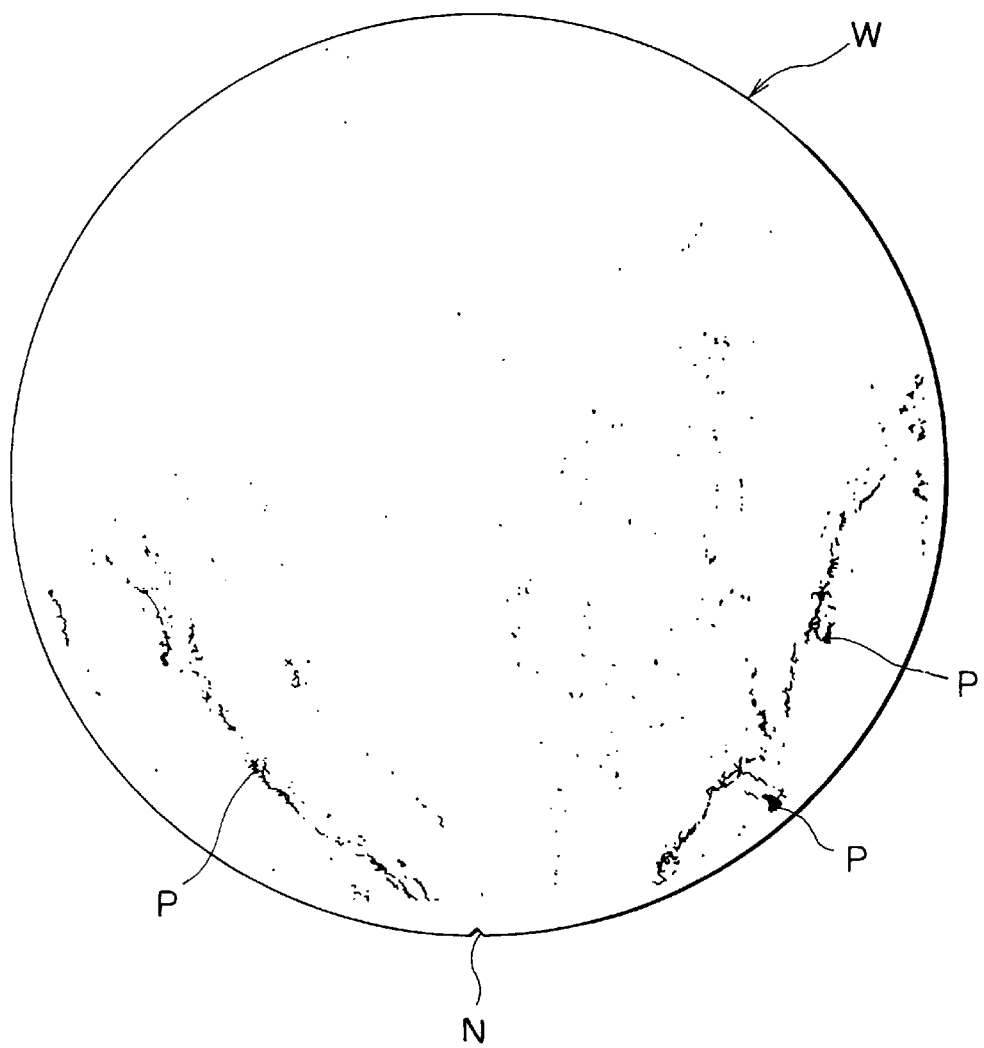
F I G. 14

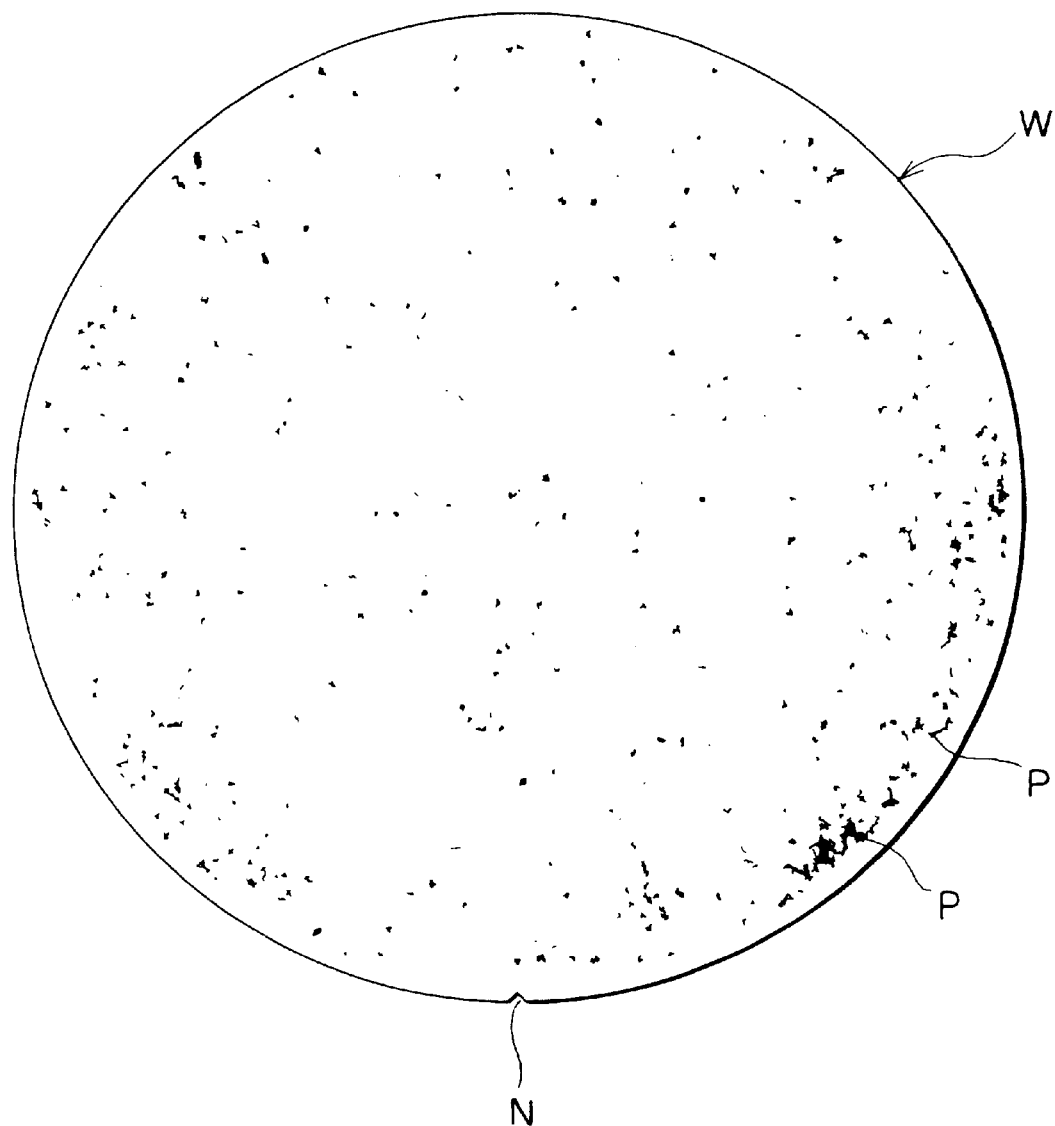
F I G. 16

SUBSTRATE PROCESSING METHOD AND APPARATUS

BACKGROUND OF THE INVENTION

1. Field of the Invention

The present invention relates to a substrate processing method and a substrate processing apparatus. More specifically, the present invention relates to a substrate processing method and a substrate processing apparatus for processing objects, such as semiconductor wafers or LCD substrates, with a processing liquid and cleaning the objects with a cleaning liquid.

2. Description of the Related Art

Generally, a semiconductor wafer processing apparatus has prevalently been used in fabricating semiconductor devices to remove particles, organic substances, metallic contaminants and/or an oxide film from objects, such as semiconductor wafers, (hereinafter referred to as "wafers") by sequentially conveying the wafers through processing tanks containing processing liquids (chemical liquids) and cleaning tanks containing cleaning liquids (rinsing liquids) to immerse the wafers in the processing liquids and the cleaning liquids and to dry the wafers.

A wafer processing apparatus of this kind comprises processing tanks respectively containing processing liquids (chemical liquids), such as $HF+H_2O$ (a hydrogen fluoride solution (hereinafter referred to as "HF")), $NH_4OH+H_2O_2+H_2O$ (an ammonia peroxide solution) and $HCl+H_2O_2+H_2O$ (a hydrochloric acid peroxide solution), cleaning tanks respectively containing cleaning liquids, such as rinsing liquids (pure water), wafer holders, such as wafer boats, for holding a plurality of wafers, for example, fifty wafers, in a vertical attitude, and lifting devices for immersing the wafer boat holding wafers in, and taking out the same from the processing tanks and the cleaning tanks.

The processing tanks, the cleaning tanks and the wafer boats are placed in a downflow atmosphere in which a clean gas, for example, clean air flows down to handle the wafers or the like in a clean atmosphere.

Generally, the wafers or the like made of silicon are provided on their surfaces with an oxide film serving as an insulating film, and a predetermined pattern or the like. When a silicon wafer provided on its surface with an oxide film is processed with a processing liquid, the processing liquid remains on the surface of the silicon wafer because the oxide film is hydrophilic while silicon is hydrophobic. Experiments were conducted to verify this fact. In the experiments, a wafer boat B holding coated silicon wafers Wa coated with an oxide film and bare silicon wafers Wb as shown in FIG. 18A was immersed in a processing liquid, such as HF, contained in a processing tank for processing, and then the wafer boat was taken out of the processing liquid. At this stage, the processing liquid (HF) remained on the surfaces of the coated silicon wafers Wa as shown in FIG. 18B. When the coated silicon wafers Wa and the bear silicon wafers Wb were immersed in a processing liquid or a cleaning liquid for the subsequent process, particles P contained in the processing liquid (HF) remaining on the coated silicon wafers Wa adhered to the surfaces of the coated silicon wafers Wa and therefrom to the surfaces of the adjacent bare silicon wafers Wb as shown in FIG. 18B. As is obvious from the results of the experiments, particles adhere to the surfaces of wafers when silicon wafers coated with an oxide film are processed with a processing liquid and cleaned with a cleaning liquid, and those particles reduces the yield of products.

When etching oxide films formed on the surfaces of wafers W with a processing liquid, such as HF, the wafers W are immersed in the processing liquid (HF) contained in a processing tank, the wafers W are taken out of the processing tank, and the wafers W are carried to a cleaning tank. While the wafers W are thus being carried to the cleaning tank, the processing liquid (HF) remaining on the wafers W flows downward along the surfaces of the wafers W held in a vertical attitude and, consequently, the oxide films coating the wafers W are exposed partly as shown in FIGS. 19A and 19B. Since the etching of the exposed parts of the oxide films is stopped, while the etching of the coated parts of the oxide films continues, the oxide films cannot uniformly be etched, which reduces the yield of products.

SUMMARY OF THE INVENTION

Accordingly, it is an object of the present invention to prevent the reattachment of particles to wafers or substrates by removing dust contained in a processing liquid remaining on the surfaces of the substrates after the substrates have been processed with the processing liquid by recleaning the substrates when processing the substrates by immersing the same in the processing liquid and cleaning the substrates by immersing the same in a cleaning liquid, in order that the yield of products can be improved.

Another object of the present invention is to prevent the downward flow of a processing liquid remaining on substrates along the surfaces of the substrates after the substrates have been processed with the processing liquid in order that etching uniformity and the yield of products can be improved.

With the foregoing object in view, according to an aspect of the present invention, a substrate processing method, which processes substrates by immersing the substrates held in a vertical attitude in a processing liquid and a cleaning liquid, is characterized in cleaning lower parts of the substrates at at least one of the time when the substrates are immersed in one of the processing liquid and the cleaning liquid contained in a tank and the time when the substrates have been exposed to one of the processing liquid and the cleaning liquid contained in the tank. The term "subjected to one of the processing liquid and the cleaning liquid" refers to either an act of pulling out the substrates from the processing liquid or the cleaning liquid contained in the tank or an act of draining the processing liquid or the cleaning liquid from the tank. Immersing the substrates in the processing liquid or the cleaning liquid signifies either an act of immersing the substrates in the processing liquid or the cleaning liquid contained in the tank or an act of wetting the substrates with the processing liquid or the cleaning liquid.

In the substrate processing method of the present invention, the lower parts of the substrates can be cleaned by ejecting a cleaning liquid on the lower parts of the substrates or by immersing the lower parts of the substrates in a cleaning liquid contained in a tank for a predetermined time. The lower parts of the substrates may be immersed in and kept stationary in the cleaning liquid. When thus immersing the lower parts of the substrates in the cleaning liquid, it is preferable that the cleaning liquid is supplied to the tank so that the cleaning liquid overflows the tank.

The substrates are supposed to be made of a hydrophobic material to have surfaces coated with hydrophilic films. Hydrophilic substrates are, for example, bare silicon substrates and metal substrates. Hydrophilic films are, for example, oxide films or insulating films.

According to another aspect of the present invention, a substrate processing method, which brings substrates held in a vertical attitude into a processing liquid and a cleaning liquid to process the substrates, processes the substrates in an atmosphere in which a clean gas flows down, and reduces or stops the flow of the clean gas when carrying the substrates processed by the processing liquid to the next processing unit for processing the substrates with another processing liquid or the cleaning liquid.

According to a further aspect of the present invention, a substrate processing method, which brings substrates held in a vertical attitude into a processing liquid and a cleaning liquid to process the substrates, blows a clean gas upward from below the substrates against the substrates when carrying the substrates processed with the processing liquid to the next processing unit for processing the substrates with another processing liquid or the cleaning liquid. The clean gas may be, for example, clean air or clean nitrogen gas.

According to a still further aspect of the present invention, a substrate processing apparatus, which carries out a substrate processing method of the present invention, comprises a processing tank containing a processing liquid in which substrates are to be immersed, a cleaning tank containing a cleaning liquid in which the substrates are to be immersed, substrate holding means for holding the substrates in a vertical attitude, lifting means for vertically moving the substrate holding means holding the substrates relative to the processing tanks or the cleaning tanks, in which liquid ejecting means for ejecting a processing liquid or a cleaning liquid toward lower parts of the substrates is disposed above the processing tanks or above the cleaning tanks.

According to another aspect of the present invention, a substrate processing apparatus, which carries out a substrate processing method of the present invention, comprises a processing tank containing a processing liquid in which substrates are to be immersed, a cleaning tank containing a cleaning liquid in which the substrates are to be immersed, substrate holding means for holding the substrates in a vertical attitude, lifing means for vertically moving the substrate holding means holding the substrates relative to the processing tanks or the cleaning tank, in which a control means controls the lifting means so that the lifting means is stopped when lowering the substrate holding means holding the substrates to immerse the substrates in the cleaning liquid contained in the cleaning tank at a position where lower parts of the substrates are immersed in the cleaning liquid.

According to a further aspect of the present invention, a substrate processing apparatus, which carries out a substrate processing method of the present invention, comprises a processing tank in which substrates are brought into contact with a processing liquid, a cleaning tank in which the substrates are brought into contact with a cleaning liquid, substrate holding means for holding the substrates in a vertical attitude, and lifting means for vertically moving the substrate holding means holding the substrates relative to the processing tank or the cleaning tanks, in which the processing tanks are disposed in a downflow atmosphere in which a clean gas flows down, and a control means stops or reduces the downflow of the clean gas creating the atmosphere. Preferably, the control means stops or reduces the flow of the clean gas when the substrates are carried from the processing tank to another processing tank or the cleaning tank.

According to a still further aspect of the present invention, a substrate processing apparatus, which carries out a substrate processing method of the present invention, comprises a processing tank in which substrates are brought into contact with a processing liquid, a cleaning tank in which the substrates are brought into contact with a cleaning liquid, substrate holding means for holding the substrates in a vertical attitude, and lifting means for vertically moving the substrate holding means holding the substrates relative to the processing tank or the cleaning tank, in which a clean gas ejecting means ejects a clean gas upward from below the substrates when the substrates processed with the processing liquid are carried to another processing tank or the cleaning tank. The lifting means may include a carrying means for carrying the substrates between the processing tank and the cleaning tank. The substrate processing apparatus may further comprise, besides the lifting means, a carrying means for carrying the substrates between the processing tank and the cleaning tank. Although the cleaning tank may be of any type provided that the same are able to contain cleaning liquids, it is preferable that the cleaning tanks are overflow tanks that allow the overflow of the cleaning liquids.

In the present invention, the lower part of the substrate is a part having a region extending between the lower edge of the substrate and a region near a circuit region in which semiconductor devices are built.

The above and other objects, features and advantages of the present invention will become more apparent from the following description taken in connection with the accompanying drawings.

BRIEF DESCRIPTION OF THE DRAWINGS

FIG. 4 is a vertical sectional view of the substrate processing apparatus of FIG. 2;

FIG. 6 is a schematic front view of a wafer, in which a shaded region is a lower part of the wafer to be cleaned;

FIG. 9 is a schematic vertical sectional view of an essential part of a substrate processing apparatus in a fourth embodiment of the present invention;

FIG. 11 is a schematic perspective view of a substrate carrying device in a modification of a substrate carrying device included in the substrate processing apparatus of FIG. 9;

FIG. 13 is a plan view showing the adhesion of particles to a wafer in a comparative example before the wafer is cleaned;

FIG. 14 is a plan view showing the adhesion of particles to the wafer of FIG. 13 after the wafer has been cleaned;

FIG. 16 is a plan view showing the adhesion of particles to the wafer of FIG. 15 after the wafer has been cleaned;

DESCRIPTION OF THE PREFERRED EMBODIMENTS

The preferred embodiments of the present invention will be described hereafter with reference to the accompanying drawings as applied to semiconductor wafer processing systems.

Figure 1:
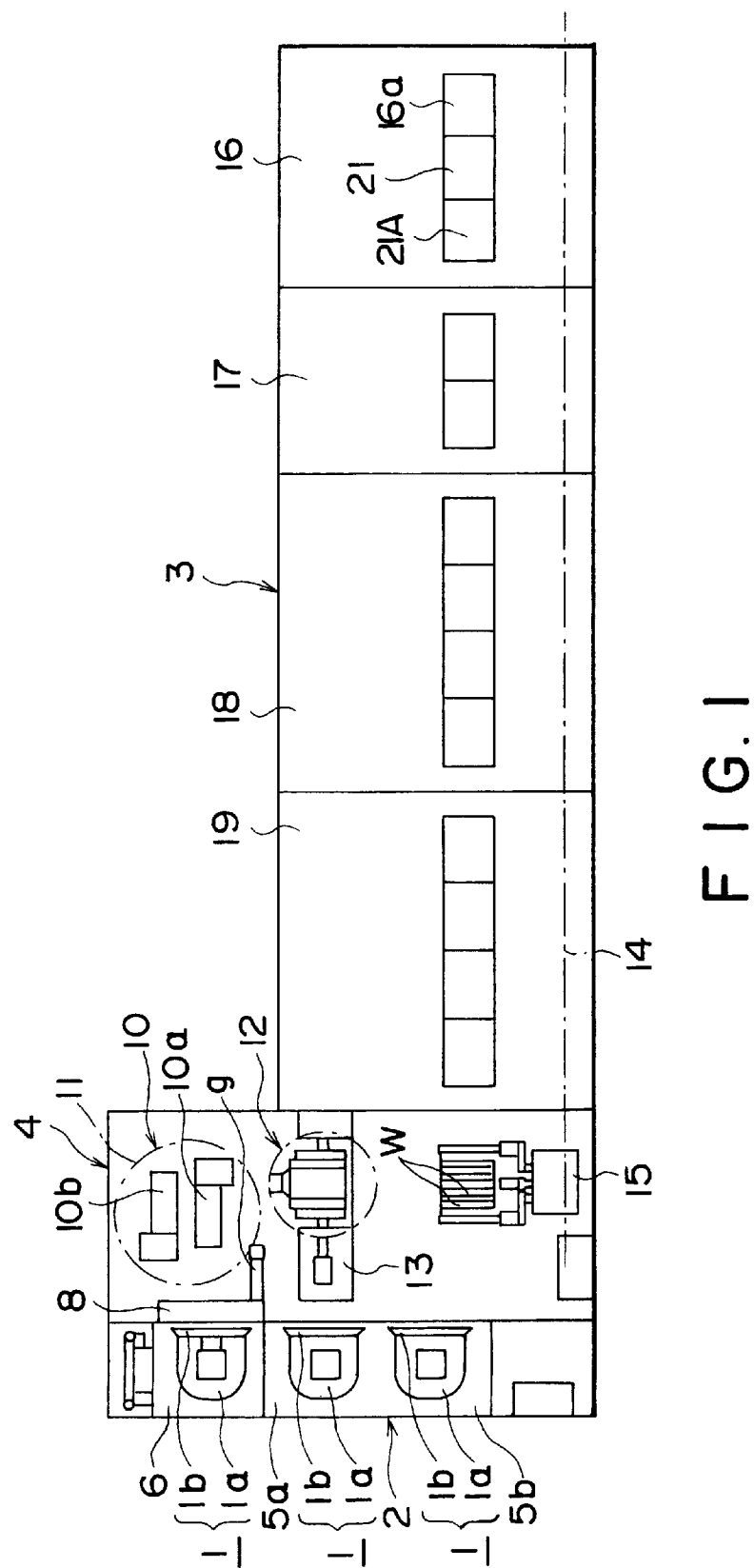
FIG. 1 is a schematic plan view of a substrate processing system including a substrate processing apparatus according to the present invention.

FIG. 1 shows a substrate processing system including a wafer processing apparatus according to the present invention by way of example. The wafer processing system comprises, as principal components, a carrying station 2 for carrying a carrier containing semiconductor wafers W in a horizontal position, a processing station 3 for processing wafers W with processing liquids (chemical liquids) and cleaning liquids and drying the wafers W, and a transfer station 4 interposed between the wafer carrying station 2 and the processing station 3 to transfer the wafers W, to adjust the locations of the wafers W, to change the attitude of the wafers W, and to adjust intervals between the wafers W.

The carrying station 2 is disposed at one end of the wafer processing system and has a carrier receiving station 5a, a carrier delivery station 5b disposed beside the carrier receiving station 5a, and a wafer handling station 6. The carrier receiving station 5a and the wafer handling station 6 are connected by a carrying mechanism, not shown, to carry the carrier 1 from the carrier receiving station 5a to the wafer handling station 6.

Carrier lifters, not shown, are installed at the carrier delivery station 5b and the wafer handling station 6 to transfer empty carriers 1 to a carrier storage station, not shown, above the carrying station 2 and to receive empty carriers 1 from the carrier storage station. A carrier carrying robot, not shown, capable of moving in horizontal directions (X-directions and Y-directions) and vertical directions (Z-directions) is installed in the carrier storage station. The carrier carrying robot arranges empty carriers 1 carried from the wafer handling station in rows and carries the empty carriers 1 to the carrier delivery station 5b. Carriers 1 containing wafers W, as well as empty carriers 1, can be stored in the carrier storage station.

The carrier 1 has a case 1a having an opening, and side walls provided in their inner surfaces with holding grooves, not shown, for holding a plurality of wafers W, such as twenty-five wafers W, in a horizontal attitude, and a lid 1b for covering the opening of the case 1a. The lid 1b is opened and closed by operating a lid locking device, not shown, incorporated into the lid 1b by a lid operating device 8.

The wafer handling station 6 has an opening opening into the transfer station 4, and the lid operating device 8 is disposed in the opening. The lid operating device 8 opens and closes the lid 1b. The lid operating device 8 removes the lid 1b of a carrier 1 containing unprocessed wafers W and delivered to the wafer handling station 6 so that the unprocessed wafers W can be taken out. After all unprocessed wafers W have been taken out of the carrier 1, the lid operating device 8 puts the lid 1b on the case 1a of the carrier 1 to close the opening of the case 1a. The lid operating device 8 removes the lid 1b of an empty carrier 1 transferred from the carrier storage station to the wafer handling station 6 to open the opening of the case 1a of the case 1 of the empty carrier 1. After the empty carrier 1 has been fully loaded with wafers W, the lid operating device 8 puts the lid 1b on the case 1a of the fully loaded carrier 1. A mapping sensor 9 for counting the number of wafers W loaded into a carrier 1 is disposed near an opening in the wafer handling station 6.

The transfer station 4 comprises a wafer transfer device 10 capable of holding a plurality of wafers W, such as twenty-five wafers, in a horizontal attitude and of taking the wafers W from a carrier 1 placed in the wafer handling station 6 and delivering the same to a carrier 1 placed in the wafer handling station 6, a pitch changing device, i.e., a pitch adjusting means, not shown, capable of holding a plurality of wafers W, such as fifty-two wafers, in a vertical attitude, an attitude changing device 12 capable of changing the attitude of a plurality of wafers W, such as twenty-five wafers, between a horizontal attitude and a vertical attitude, and a notch aligner 13 capable of detecting notches formed in wafers W set in a vertical attitude and of adjusting the attitudes of the wafers W. A carrying passage 14 is extended between the processing station 3 and the transfer station 4. A wafer carrying chuck 15, i.e., a wafer carrying means, moves along the carrying passage 14.

The wafer transfer device 10 includes a first arm 10a and a second arm 10b, i.e., holding means, capable of taking a plurality of wafers W out of a carrier 1 placed in the wafer handling station 6, carrying the wafers W and putting a plurality of wafers W into a carrier 1. The two arms 10a and 10b are mounted on a table 11 capable of moving in horizontal directions (X-directions, Y-directions) and vertical directions (Z-directions) and of turning in θ-directions. The arms 10a and 10b operate individually to hold wafers W in a horizontal attitude and to transfer wafers W between a carrier 1 placed in the wafer handling station 6 and the attitude changing device 12. The first arm 10a is able to hold unprocessed wafers W, while the second arm 10b is holding processed wafers W.

A plurality of processing units 16 to 19 are arranged in a row in the processing station 3. Each of the processing units 16 to 19 is provided with a wafer processing apparatus of the present invention for removing particles and organic substances adhering to wafers W or removing metal or oxide films from wafers W. The wafer carrying chuck 15 is capable of moving in horizontal directions (X-directions, Y-directions) and vertical directions (Z-directions) and of turning in θ-directions on the crying passage 14. The first processing unit 16 includes a chuck cleaning device 16a. The chuck cleaning device 16a need not necessarily be included in the first processing unit 16; the chuck cleaning device 16 a may be disposed outside the first processing unit 16 or the other processing units 17, 18 and 19.

Wafer processing apparatus in preferred embodiments of the present invention will be described with reference to FIGS. 2 to 8.

First Embodiment

Figure 2:
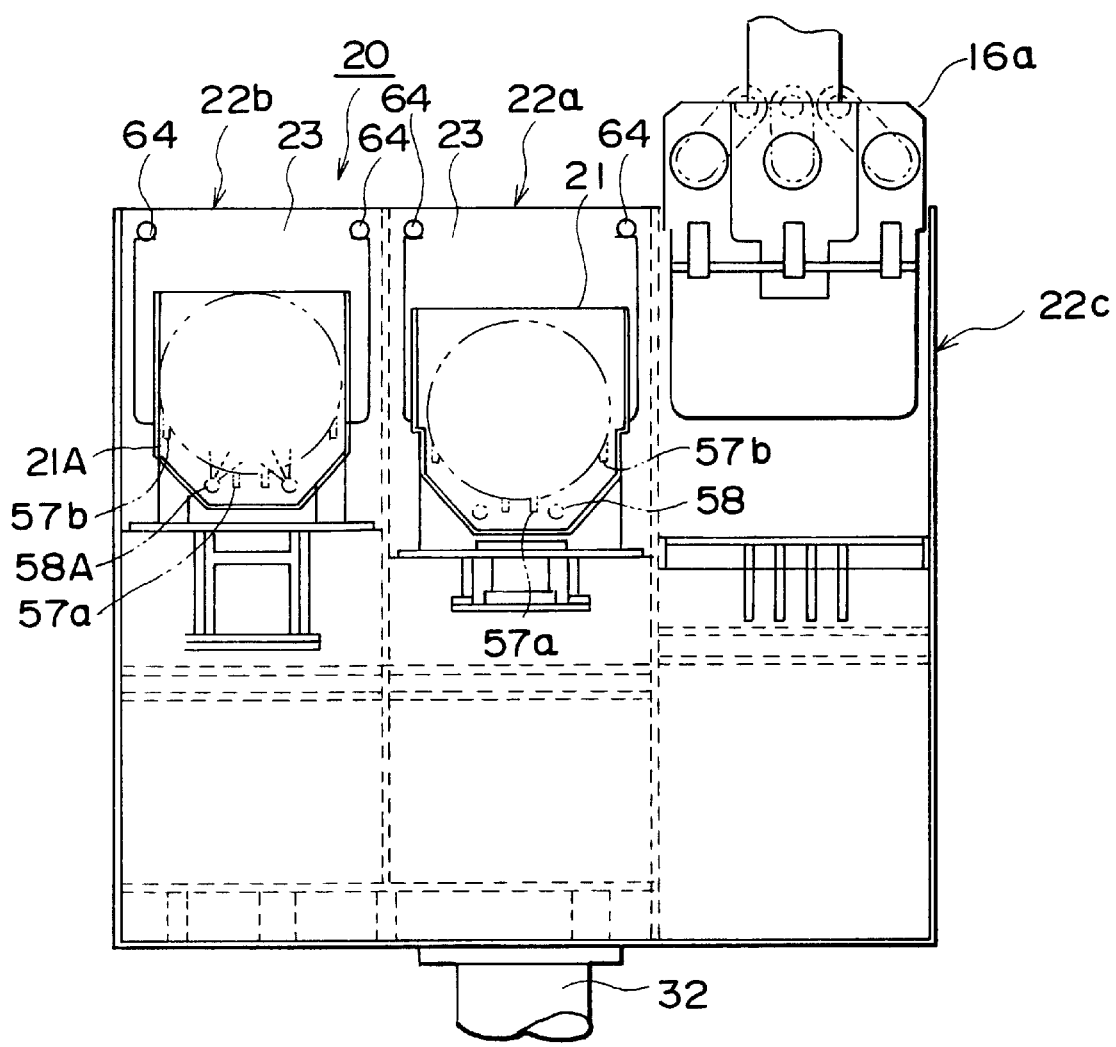
FIG. 2 is a schematic side view of a substrate processing apparatus in a first embodiment of the present invention.
Figure 3:
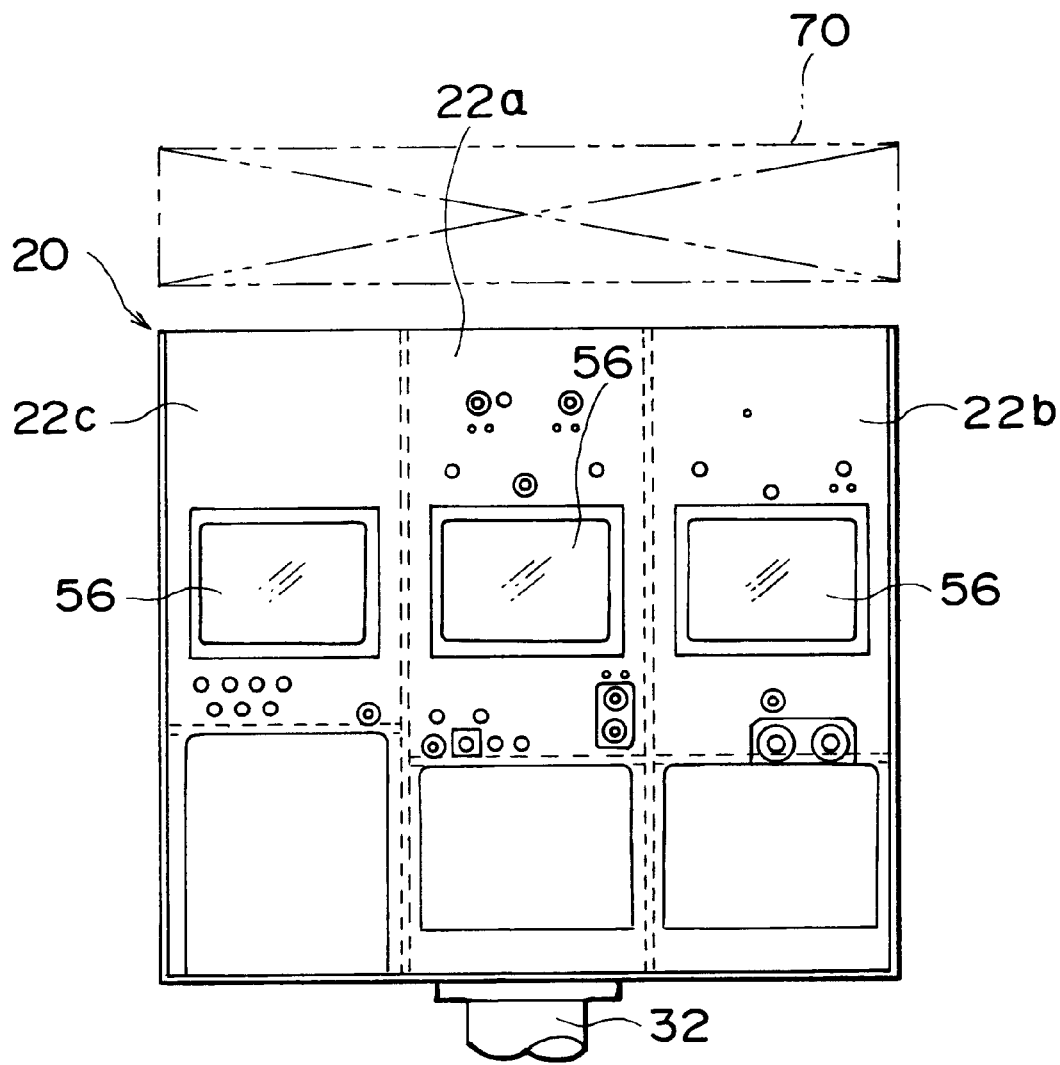
FIG. 3 is a rear end view of the substrate processing apparatus of FIG. 2.

FIG. 2 is a schematic side view of a wafer processing apparatus in a first embodiment of the present invention installed in the first processing unit 16, FIG. 3 shows a rear end view of the wafer processing apparatus of FIG. 2 and FIG. 4 shows a vertical sectional view of an essential part of the wafer processing apparatus of FIG. 2.

Referring to FIG. 2, a wafer processing apparatus 20 has a first vessel 22a having the shape of, for example, a rectangular tube and housing a processing tank 21 containing a processing liquid, such as HF (chemical liquid), in which wafers W are immersed, a second vessel 22b disposed contiguously with the first vessel 22a, having the shape of, for example, a rectangular tube and housing a cleaning tank 21A containing a cleaning liquid, such as a rinsing liquid (pure water), and a third vessel 22c disposed contiguously with the first vessel 22a, as also shown in FIG. 3, having the shape of, for example, a rectangular tube and housing a chuck cleaning device 16a. A space between the plurality of vessels 22a, 22b and 22c, and a filter unit 70, which will be described later, is sealed and isolated from the external atmosphere by outer walls of the wafer processing apparatus 20.

As shown in FIGS. 3 and 4, the first vessel 22a and the second vessel 22b are substantially the same in construction, and hence only the first vessel 22a will be described. A processing chamber 23 is defined by a bottom plate 23a in the first vessel 22a and the processing tank 21 is placed in the processing chamber 23. A side suction passage 24 and a bottom suction passage 25 connected to the side suction passage 24 are formed in the first vessel 22a. The filter unit 70 for supplying a clean gas, such as clean air, into the processing chamber 23 is disposed above the processing chamber 23 of the first vessel 22a. The filter unit 70 is provided with a motor-driven fan, not shown.

The side suction passage 24 is defined by a front wall 26 of the first vessel 22a, and a first partition wall 28 consisting of an inner upright wall 27 extending upward from the bottom plate 23a defining the processing chamber 23 and a wall continuous with and extending downward from the upright wall 27. The bottom suction passage 25 is defined by a bottom wall 30 of the first vessel 22a, and a second partition wall 29 substantially horizontally extending from the lower end of the first partition wall 28.

The bottom wall 30 of the first vessel 22a is provided with an outlet opening 33 and a drain port 34, i.e., draining opening. A suction pipe 32 has one end connected to the outlet opening 33 and the other end connected to a vacuum pump 31, i.e., suction means. A gas-liquid separating wall 35 is formed on the inner surface of the bottom wall 30 so as to surround the outlet opening 33 to prevent liquids including a chemical liquid, such as HF, and contained in air to be discharged through the outlet opening 33 from flowing into the suction pipe 32. The position of the outlet opening 33 on the bottom wall 30 is optional. A drain pipe 37 provided with a drain valve 36 is connected to the drain port 34 to drain waste liquids collected on the bottom wall 30 of the first vessel 22a.

An adjustable flow control plate 38 is disposed above the open upper end of the side suction passage 24 so as to cover the side suction passage 24 and an upper end part of the upright wall 27, A space between the upright wall 27 and the flow control plate 28 is adjustable. As shown in FIG. 4, the flow control plate 38 has a horizontal part 38a covering the opening of the side suction passage 24, and a vertical part 38b extending vertically downward from an end of the horizontal part 38a on the side of the processing tank. A bolt 39 is screwed through a slot, not shown, in the horizontal part 38a in a threaded hole formed in a bracket 40 projecting inward from the front wall 26 of the vessel 22a to fasten the flow control plate 28 at an appropriate position to the bracket 40 so that an appropriate space is secured between the vertical part 38b of the flow control plate 38 and the upright wall 27.

Thus, the width of a space between the vertical part 38b of the flow control plate 38 and the upright wall 27 can be adjusted by adjusting the position of the horizontal part 38a of the flow control plate 38 on the bracket 40 to adjust the flow rate of air flowing through the processing tank 21 and the processing chamber 23 optionally. The flow rate of air flowing through the side suction passage 24 can be adjusted to the flow rate of clean air supplied through the filter unit 70 into the first vessel 22a. The respective positions of the flow control plates 38 of the vessels 22a, 22b and 22c can be adjusted so that the quantity of clean air supplied into the respective processing chambers 23 of the vessels 22a, 22b and 22c is equal to the sum of the quantities of air that flows through the respective side suction passages 24 of the vessels 22a, 22b and 22c.

Escape of the gas supplied into the processing chamber 23 through passages other than a discharge system can be prevented by balancing the quantity of clean air supplied into the processing chamber 23 and that of air discharged from the processing chamber 23.

The pressures in the processing chambers 23 of the vessels 22a, 22b and 22c can be adjusted so that the pressure in the processing chamber 23 in which the processing tank 21 containing a chemical liquid, such as HF, is placed is lower than that in the processing chamber 23 in which the processing tank 21 containing a liquid other than chemical liquids is placed to prevent an atmosphere of the chemical liquid from flowing into the vessels in which any chemical liquids are not used.

Although the position of the flow control plate 38 is adjusted manually in this embodiment, the position of the flow control plate 38 may be adjusted by moving the flow control plate 38 by a driving device, such as a cylinder actuator or a motor.

A discharge pressure sensing device 41 is disposed between the upright wall 27 and the flow control plate 38 to measure the pressure of air discharged from the processing chamber 23. As shown in FIG. 4, the discharge pressure sensing device 41 has a pipe 44a supported by a pipe fitting 43 hermetically inserted in holes formed in the front wall 26 and the upright wall 27 at corresponding positions, and a pressure gage 44b disposed outside the vessel 22a and connected to the pipe 44a. The pipe 44a is exposed to air in the space between the upright wall 27 and the vertical part 38b of the flow control plate 38.

A lower chamber 45 is defined in the lower part of the processing chamber 23 by the bottom plate 23a of the processing chamber 23, side walls 26a adjacent to the front wall 26, a back wall 26b and the upright wall 27. The volume of the lower chamber 45 is not less than that of processing liquid, such as HF, or pure water contained in the processing tank 21. Since the volume of the lower chamber 45 is not less than that volume of the processing liquid or the volume contained in the processing tank 21, the processing liquid and the like can be stored in the lower chamber 45 to secure safety even if, by any chance, the processing tank 21 should be broken and the processing liquid and the like should spill. The bottom plate 23a of the processing chamber 23 is sloped in a decline toward the back wall 26b. A drain port 46 is formed in the back wall 26b near the joint of the bottom plate 23a and the back wall 26b, and a drain pipe 47 provided with a drain valve, not shown, is connected to the drain port 46.

A machine chamber 48 having an open back end is defined by the bottom plate 23a of the processing chamber 23, the first partition wall 28 and the second partition wall 29. A processing liquid handling system for supplying and draining the processing liquid is installed in the machine chamber 48 to secure a neat space 53 behind the wafer processing apparatus. The processing liquid handling system includes a circulation pump 49, a damper 50, a heater 51, and piping system 52 connecting the components of the processing liquid handling system. Only the piping system 52 is arranged in the space 53 for the effective use of the space.

Measuring instruments and operating devices, not shown, are disposed in a space 54 behind an upper part of the front wall 26 of the vessel 22a (22b). A cover 55 is attached removably to the upper part of the front wall 26 to cover the front open end 54a of the space 54. The back wall 26b of the vessel 22a is provided with an observation hole 56 to enable the visual observation of the interior of the vessel 22a.

When the first vessel 22a, the second vessel 22b and the third vessel 22c are joined in a row so that the vessels 22a, 22b and 22c communicate with each other by means of at least either the side suction passages 24 or the bottom suction passages 25, air flowing through the vessels 22a, 22b and 22c can be discharged outside through the outlet opening 33 of the first vessel 22a. When processing wafers W for processing and cleaning, clean air supplied through the filter unit 70 into the processing tanks 21 and the processing chambers 23 of the wafer processing apparatus 20 is polluted with the chemical liquids and pure water scattered from the processing tanks 21. Since the polluted air can be discharged outside through the side suction passages 24 and the bottom suction passages 25, the accuracy of processes for processing and cleaning the wafers W can be improved.

The processing tank 21 has an inner tank 21a for receiving wafers W therein, and an outer tank 21b surrounding an open upper end part of the inner tank 21a and capable of storing the processing liquid overflowed the inner tank 21a. A wafer boat 57, i.e., a liftable holding means, capable of holding a plurality of wafers W in a vertical attitude is disposed in the inner tank 21a. A plurality of wafers W, for example, fifty wafers W, are transferred between the wafer boat 57 and the wafer carrying chuck 15.

As shown in FIG. 2, the wafer boat 57 comprises a pair of lower holding bars 57a on which lower parts of wafers W rest, and a pair of side holding bars 57b disposed above the lower holding bars 57a to hold the wafers W by their side parts. The wafer boat 57 is moved vertically by a lifting mechanism 80 shown in FIG. 4, comprising, for example, a ball-screw mechanism and a cylinder actuator and connected to the wafer boat 57. The wafer boat 57 holding wafers W is lowered to immerse the wafers W in the processing liquid contained in the processing tank 21, and is raised to pull the wafers W out of the processing liquid. The lifting mechanism 80 is controlled for a wafer boat moving operation by control signals provided by a lifting mechanism controller 81.

Processing liquid ejecting pipes 58 (FIG. 2) are extended in a lower part of the interior of the inner tank 21a to supply the processing liquid into the inner tank 21a. The inner tank 21a is provided in its bottom wall with a drain port 21c. Drain pipes 59 each provided with a drain valve, not shown, are connected to the drain ports 21c, respectively. The outer tank 21b is provided in its bottom wall with a drain port 21d. A drain pipe 60 provided with a drain valve, not shown, has one end connected to the drain port 21d and the other end connected via a selector valve, now shown, to the piping system 52 included in the processing liquid handling system. The processing liquid overflowed the inner tank 21a can be returned through the drain port 21d of the outer tank 21b to the piping system 52 and can be circulated to use the same again for processing wafers W.

Figure 5:
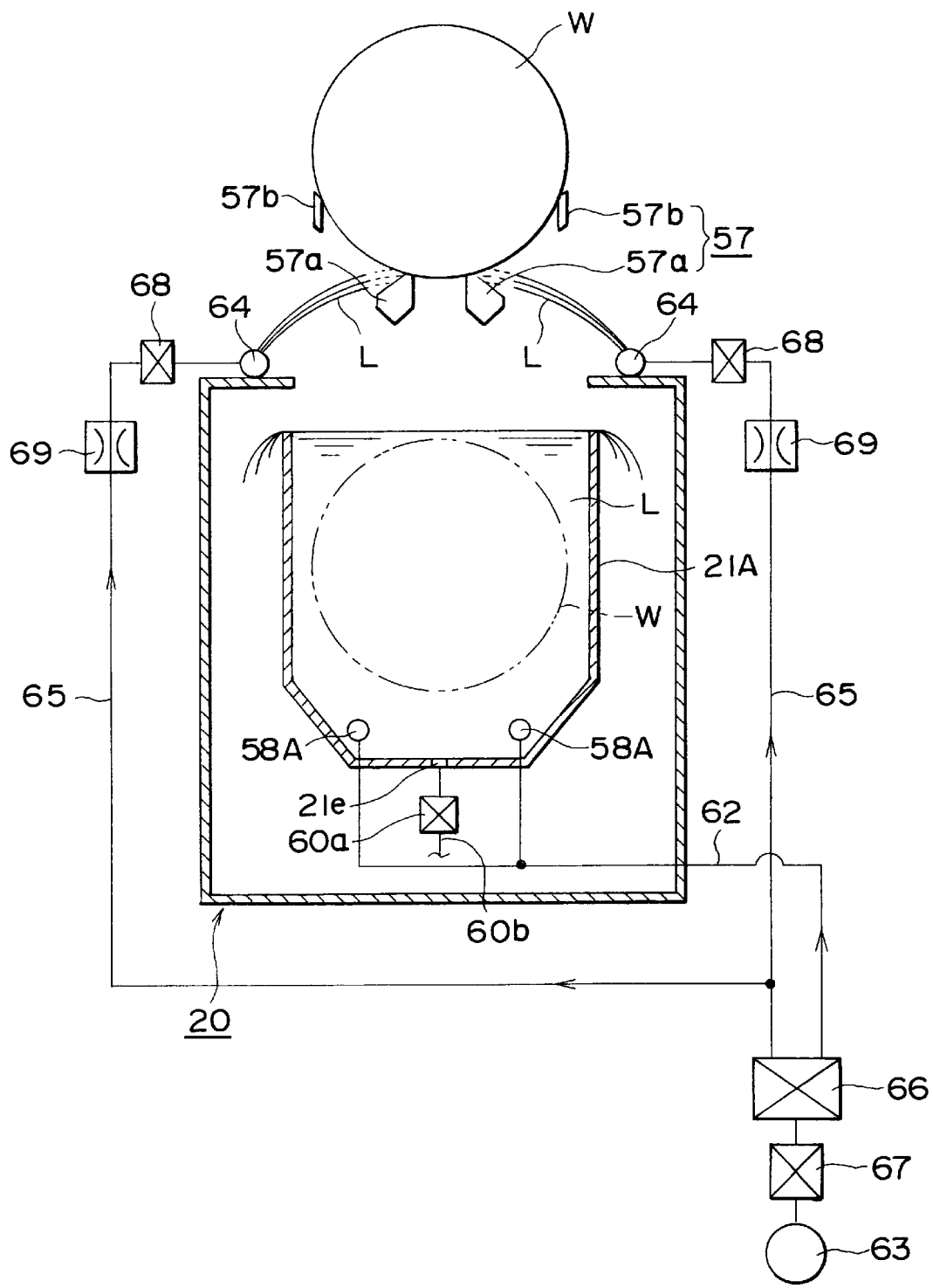
FIG. 5 is a vertical sectional view of an essential part of the substrate processing apparatus of FIG. 2.

Referring to FIGS. 2 and 5, cleaning liquid ejecting pipes 58A for supplying a cleaning liquid, such as pure water, into the cleaning tank 21A are extended in a lower part of the interior of the cleaning tank 21A placed in the second vessel 22b. The cleaning liquid ejecting pipes 58A are connected to a cleaning liquid source 63 via a first cleaning liquid supply pipe 62. A pair of cleaning liquid spraying pipes 64 are disposed at positions above the cleaning tank 21A and corresponding to opposite sides of the cleaning tank 21A to spray lower parts of wafers W to be placed in the cleaning tank 21A and held on a wafer boat 57 comprising a pair of lower holding bars 57a and a pair of upper holding bars 57b, and the lower holding bars 57a with a cleaning liquid, such as pure water. The lower part of each wafer W is a part having a region extending between the lower edge of the wafer W and a region near a circuit region Wp in which semiconductor devices are built. In FIG. 6, a shaded part is the lower part of the wafer W. The cleaning liquid spraying pipes 64 are connected by second cleaning liquid supply pipes 65 to the cleaning liquid source 63. The cleaning liquid can be supplied to either the cleaning liquid ejecting pipes 58A or the cleaning liquid spraying pipes 64 or can be supplied simultaneously to the cleaning liquid ejecting pipes 58A and the cleaning liquid spraying pipes 64.

An on-off valve 67 is disposed between the selector valve 66 and the cleaning liquid source 63. Each of the second cleaning liquid supply pipe 65 is connected through a restrictor 69 and an on-off valve 68 to the cleaning liquid spraying pipe 64. The cleaning tank 21A is provided in its bottom wall with a drain port 21e, and a drain pipe 60b is connected through a drain valve 60a to the drain port 21e. The wafer boat 57 similar to that used in the processing tank 21 is disposed in the cleaning tank 21A and is moved vertically by a lifting mechanism, not shown, controlled by a lifting mechanism controller, not shown.

A cleaning liquid L, such as pure water, is sprayed on the lower holding bars 57a and the wafers W immersed in and processed with the chemical liquid, such as HF, contained in the processing tank 21 before immersing the thus processed wafers W in the cleaning liquid L contained in the cleaning tank 21A to clear the wafers W of particles contained in the chemical liquid, i.e., the processing liquid, remaining on the surfaces of the lower parts of the wafer W. Thus, the processed wafers W are immersed for cleaning in the cleaning liquid L contained in the cleaning tank 21A after removing particles contained in the chemical liquid (processing liquid) remaining on the surfaces of the lower parts of the wafer W.

In this embodiment, the cleaning liquid spraying pipes 64 are disposed at positions above the cleaning tank 21A to clean the lower parts of the wafers W before immersing the wafers W in the cleaning liquid contained in the cleaning tank 21A. However, the cleaning liquid spraying pipes 64 may be extended above the processing tank 21 to spray the cleaning liquid for cleaning on the lower parts of the wafers W and the lower holding bars 57a immediately after the wafers W and the lower holding bars 57a have been lifted out of the processing tank 21. Cleaning liquid spraying pipes 64 may be extended above both the processing tank 21 and the cleaning tank 21A, and the cleaning liquid may be sprayed on the wafers W and the lower holding bars 57a both immediately after the wafers W and the lower holding bars 57a have been lifted out of the processing tank 21 and before immersing the same in the cleaning liquid contained in the cleaning tank 21A for the further perfect removal of particles adhering to the wafers W.

Second Embodiment

Figure 7:
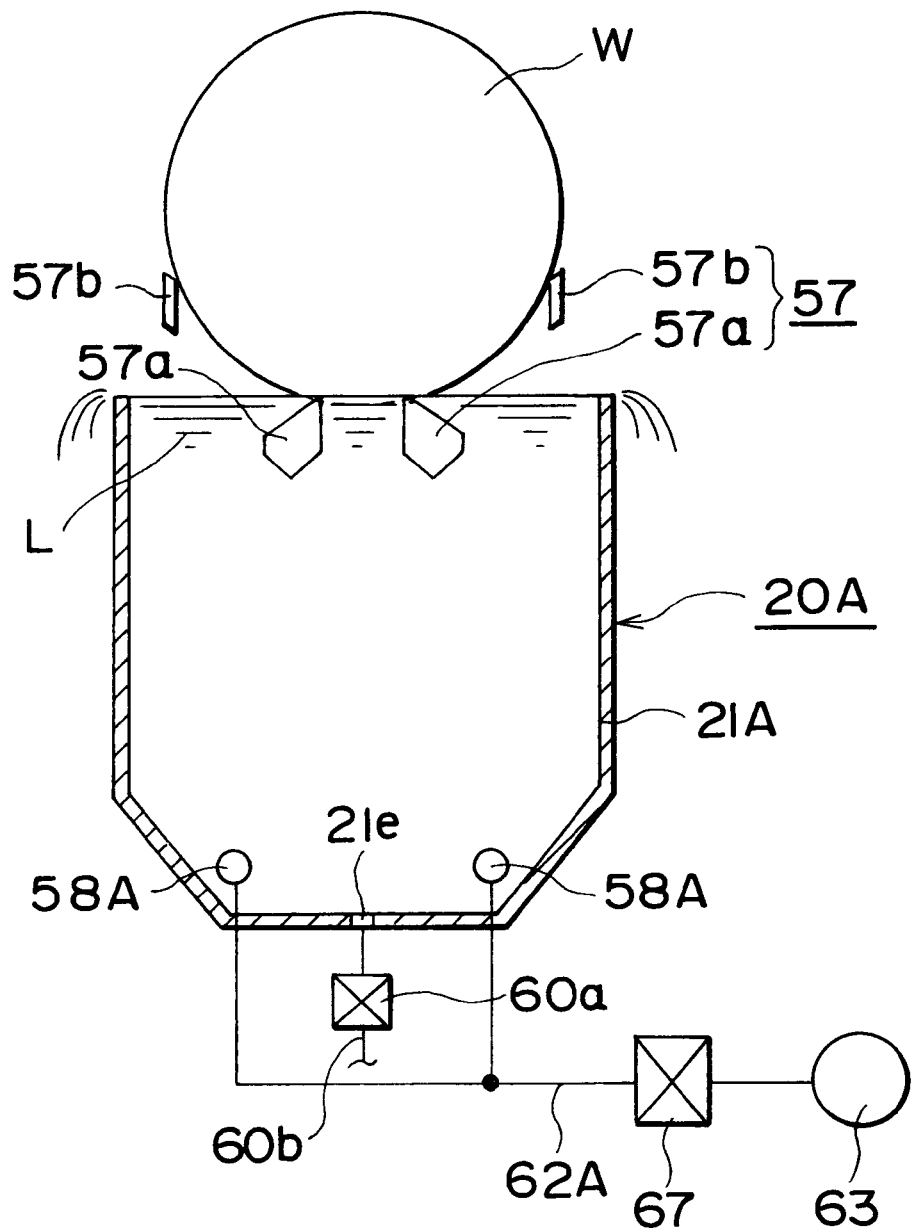
FIG. 7 is a schematic vertical sectional view of an essential part of a substrate processing apparatus in a second embodiment of the present invention.

A wafer processing apparatus in a second embodiment of the present invention will be described with reference to FIG. 7 showing an essential part of the wafer processing apparatus in a schematic sectional view, in which parts like or corresponding to those of the first embodiment are designated by the same reference characters and the description thereof will be omitted.

The wafer processing apparatus in the second embodiment removes particles adhering to the lower parts of wafers W processed with a chemical liquid by a means different from that employed in the first embodiment. A wafer cleaning unit 20A included in the wafer processing apparatus is not provided with any members corresponding to the cleaning liquid spraying pipes 64 of the first embodiment. A cleaning liquid ejecting pipes 58A extended in the bottom of a cleaning tank 21A is connected via a cleaning liquid supply pipe 62A to a cleaning liquid source 63. A wafer boat 57 having a pair of lower holding bars 57a and a pair of side holding bars 57b can be vertically moved by a lifting mechanism, not shown. The wafer processing apparatus in the second embodiment is the same in other respects as that in the first embodiment.

In the wafer processing apparatus 20A, when lowering the wafer boat 57 holding wafers W immersed in and processed with a chemical liquid, such as HF, contained in the processing tank 21 to immerse the wafers W in a cleaning liquid L, such as pure water, contained in and overflowing the cleaning tank 21A, the wafer boat 57 is stopped temporarily for a predetermined time, such as 0.5 sec, after the lower holding bars 57a and the lower parts of the wafers W have been immersed in the cleaning liquid L as shown in FIG. 7 by controlling the lifting mechanism (FIG. 4). Consequently, particles adhering to the lower parts of the wafers W are dispersed in the overflowing cleaning liquid L for quick cleaning. After thus removing the particles adhering to the lower parts of the wafers W, the wafers W are immersed in the cleaning liquid L contained in the cleaning tank 21A for cleaning. Accordingly, the reattachment of the particles to the wafers W can be prevented.

Third Embodiment

Figure 8:
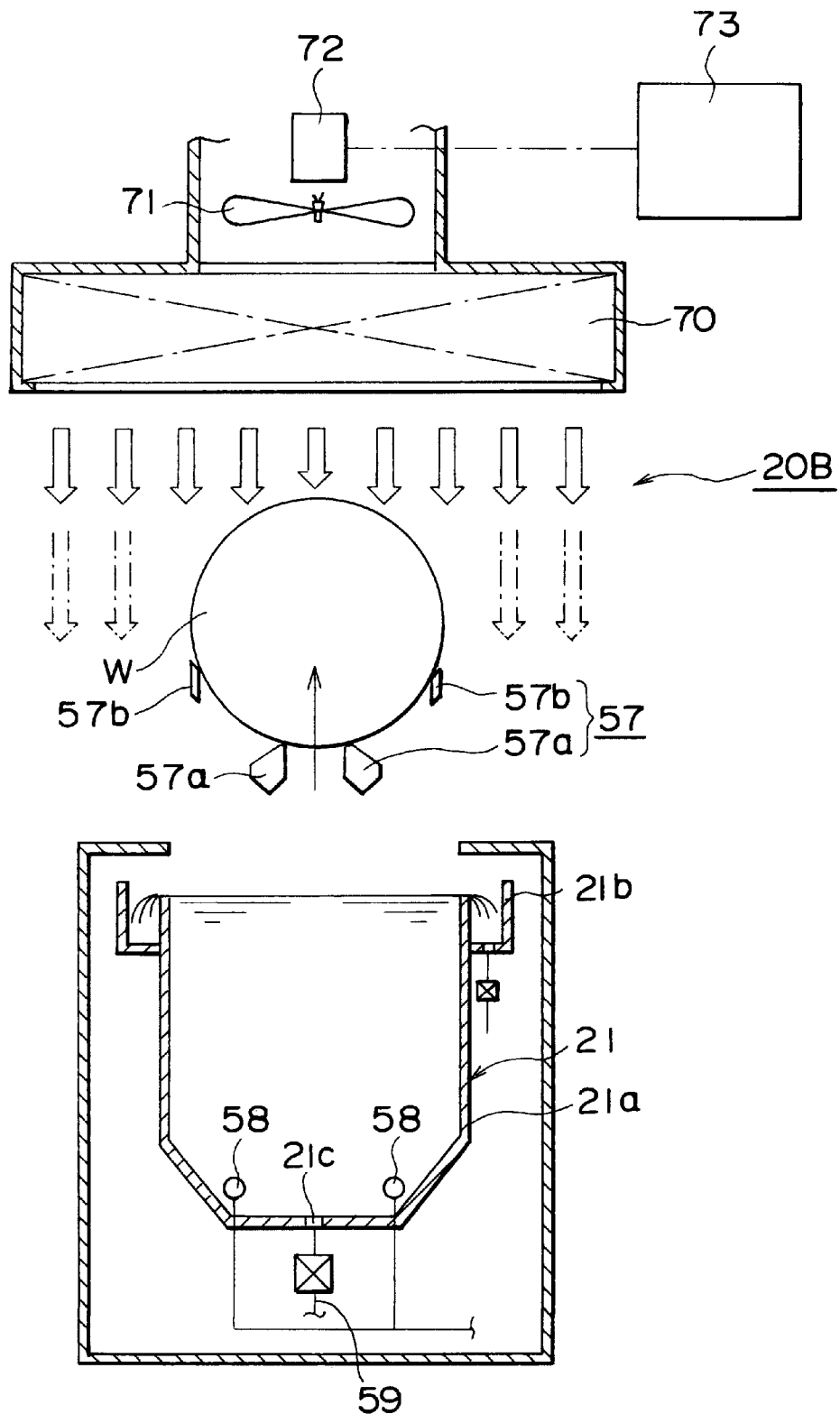
FIG. 8 is a schematic vertical sectional view of an essential part of a substrate processing apparatus in a third embodiment of the present invention.

A wafer processing apparatus in a third embodiment of the present invention will be described with reference FIG. 8 showing an essential part of the wafer processing apparatus in a schematic sectional view, in which parts like or corresponding to those of the first and the second embodiment are designated by the same reference characters and the description thereof will be omitted.

The wafer processing apparatus in the third embodiment is intended to prevent etching irregularity which is liable to occur when wafers W are processed with a chemical liquid and are cleaned with a cleaning liquid in a downflow atmosphere in which a clean gas, such as clean air, flows down. While wafers W processed with a chemical liquid are lifted out of a processing tank 21 and carried to another processing tank 21 or a cleaning tank 21A, the chemical liquid, such as HF, remaining on the wafers W is forced to flow down along the surfaces of the wafers W by the agency of gravity and the downflow of the clean gas, such as clean air, so that the surfaces of the upper parts of the wafers W become dry whereas the lower parts of the same are wet. The third embodiment is designed to prevent etching irregularity attributable to such irregular wetting of the wafers W with the chemical liquid.

Referring to FIG. 8, a wafer processing unit 20B included in the wafer processing apparatus in the third embodiment has a processing tank 21, a filter unit 70 provided with a fan 71, a motor 72 for driving the fan 71, and a controller 73 for controlling the motor 72. The configuration of a wafer cleaning unit included in the wafer processing apparatus and having a cleaning tank 21A is substantially the same as that of the wafer processing unit 20B.

When wafers W immersed in and processed with a chemical liquid, such as HF, contained in the processing tank 21 are lifted out of the processing tank 21 and are carried to another processing tank 21 or the cleaning tank 21A, the controller 73 provides a control signal for reducing the operating speed of the motor 72 to reduce the downflow of clean air from a level indicated by the arrows of alternate long and short dash lines for a normal processing operation to a level indicated by the arrows of solid lines for a wafer carrying operation below the former level. Thus, the downward flow of the processing liquid, such as HF, remaining on the wafers W toward the lower parts of the wafers W can be suppressed and, consequently, the etching uniformity of oxide films or the like formed on the surfaces of the wafers W can be improved. While the wafers W are being processed or cleaned and the wafers W are not carried, clean air is blown at the normal flow rate to suppress increase in the particle content of the atmosphere of the processing unit.

The downward flow of the processing liquid remaining on the wafers W along the wafers W may be suppressed by stopping the operation of the fan motor 72 of the filter unit 70 to stop blowing clean air instead of reducing the operating speed of the motor 72 to reduce the flow rate of clean air.

Fourth Embodiment

A wafer processing apparatus in a fourth embodiment of the present invention will be described with reference FIG. 9 showing an essential part of the wafer processing apparatus in a schematic sectional view, in which parts like or corresponding to those of the first and the second embodiment are designated by the same reference characters and the description thereof will be omitted.

In the fourth embodiment, the downward flow of a chemical liquid, such as HF, remaining on wafers W toward the lower parts of the wafer W is suppressed positively when carrying the wafers W processed with the chemical liquid in a processing tank 21 to another processing tank 21 or a cleaning tank 21A to improve the etching uniformity of oxide films or the like formed on the surfaces of the wafers W.

Referring to FIG. 9, a wafer processing unit 20C included in the wafer processing apparatus in the fourth embodiment has a processing tank 21, and a clean gas ejecting pipes 74 disposed at positions above the processing tank 21 and corresponding to opposite sides of the processing tank 21 to blow a clean gas, such as clean air or nitrogen gas, from below wafers W lifted out of the processing tank 21. The cleaning gas ejecting pipes 74 are connected by clean gas supply pipes 75 through an on-off valve 77 to a clean gas source 76. The configuration of a wafer cleaning unit included in the wafer processing apparatus and having a cleaning tank 21A is substantially the same as that of the wafer processing unit 20C.

When wafers W immersed in and processed with a chemical liquid, such as HF, contained in the processing tank 21 are lifted out of the processing tank 21 and are carried to another processing tank 21 or the cleaning tank 21A, a clean gas, such as $N_2$ gas, is ejected upward by the clean gas ejecting pipes 74 from below the wafers W to suppress the downward flow of the processing liquid adhering to the wafers W, so that the etching uniformity of oxide films or the like formed on the surfaces of the wafers W can be improved.

Figure 10A:
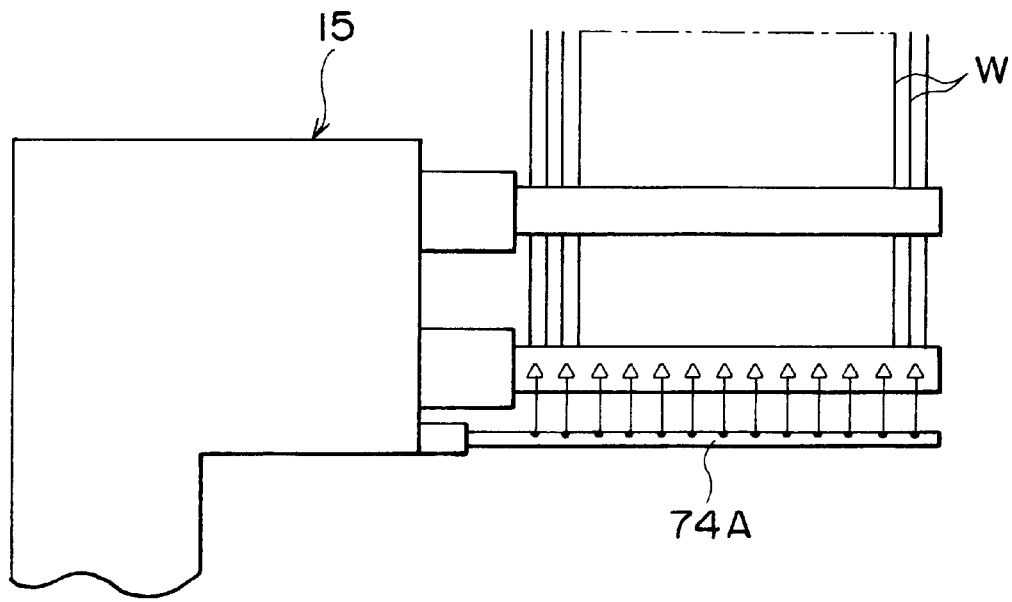
FIGS. 10A and 10B are a side view and a front view, respectively, of a clean gas ejecting device in an arrangement different from that in the same shown in FIG. 9.
Figure 10B:
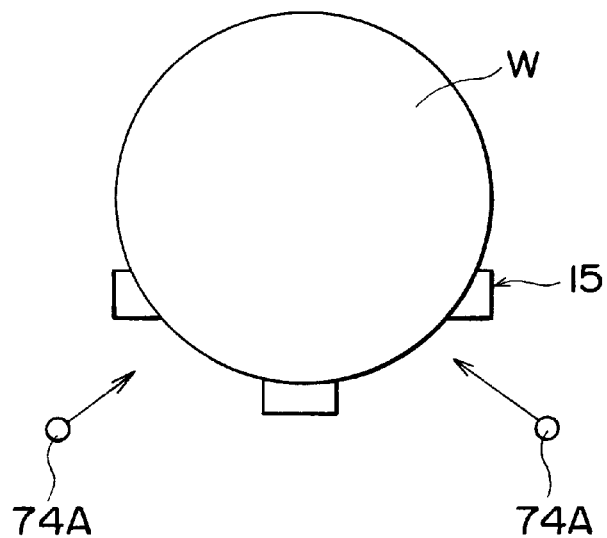

The clean gas ejecting pipes 74 may be disposed at positions above the cleaning tank 21A to eject the clean gas upward from below wafers W being lowered into the cleaning tank 21A instead of disposing the same at the positions above the processing tank 21. The clean gas ejecting pipes 74 may be disposed on a passage along which the wafers W are carried from the processing tank 21 to another processing tank or the cleaning tank 21A to eject a clean gas upward from below the wafers being carried along the passage. A wafer carrying chuck 15 may be provided with clean gas ejecting pipes 74A in its lower part, as indicated in FIGS. 10A and 10B.

In the foregoing embodiments, the wafers W are carried by the wafer carrying chuck 15, and the wafer boat 57 holding the wafers W is lowered into and lifted out of the processing tank 21 or the cleaning tank 21A. However, a wafer processing apparatus in accordance with the present invention may have a different configuration.

For example, the wafer processing apparatus may be provided with a wafer carrying chuck 15A, i.e., wafer carrying means, as shown in FIG. 11 capable of moving in horizontal directions (X-directions) and vertical directions (Z-directions), and the wafers W may be carried to the processing tank 21 and the cleaning tank 21A, and may be lowered into and lifted out of the processing tank 21 and the cleaning tank 21A by the wafer carrying chuck 15A. As shown in FIG. 11, the wafer carrying chuck 15A has a pair of horizontal support rods 15a capable of being turned about their axes, and a pair of substantially U-shaped holding frames 15b attached respectively to the support rods 15a, and each of the holding frames 15b has a lower holding bar 15c and a side holding bar 15d extended above the lower holding bar 15c. The horizontal support rods 15a are turned about their axes by a driving device, not shown, to hold a plurality of wafers W, for example, fifth wafers W, between the holding frames 15b, and the holding frames 15b holding the wafers W are moved in horizontal directions, i.e., X-directions, and vertical directions, i.e., Z-directions.

Although the present invention has been described as applied to the wafer processing apparatus to be employed in a semiconductor wafer processing system, the present invention may be applied to a processing apparatus for processing workpieces other than semiconductor wafers, such as LCD panels.

EXAMPLES

Experiment 1

Wafers WE in Example 1 processed by the wafer processing apparatus in the second embodiment and wafers WC in Comparative Example 1 processed by a conventional wafer processing apparatus were compared to verify the effect of the present invention on the reduction of reattachment of particles to wafers.

The wafers WC were immersed in a 25° C. dilute hydrogen fluoride solution (DHF: 1:50), and then the wafers WC were immersed in pure water for three minutes. Particles adhering to the wafer WC before cleaning and those adhering to the same wafer WC after cleaning were counted. The counted numbers of particles are tabulated in Table 1. FIG. 13 shows particles adhering to the wafer WC before cleaning, and FIG. 14 shows particles adhering to the wafer WC after cleaning. In FIGS. 13 and 14, indicated at P are particles and at N is a notch formed in the circumference of the wafer WC.

TABLE 1

| PARTICLE SIZE ($\mu$M) | NUMBER OF PARTICLES (COMPARATIVE EXAMPLE) | | |
|---|---|---|---|
| | BEFORE CLEANING | AFTER CLEANING | DIFFERENCE |
| 0.16–0.20 | 15 | 200 | 185 |
| 0.20–0.25 | 13 | 199 | 186 |
| 0.25–0.30 | 8 | 105 | 97 |
| 0.30–0.50 | 6 | 113 | 107 |
| 0.50–1.00 | 2 | 64 | 65 |
| 1.00– | 2 | 56 | 54 |
| TOTAL | 46 | 737 | 691 |

Figure 12:
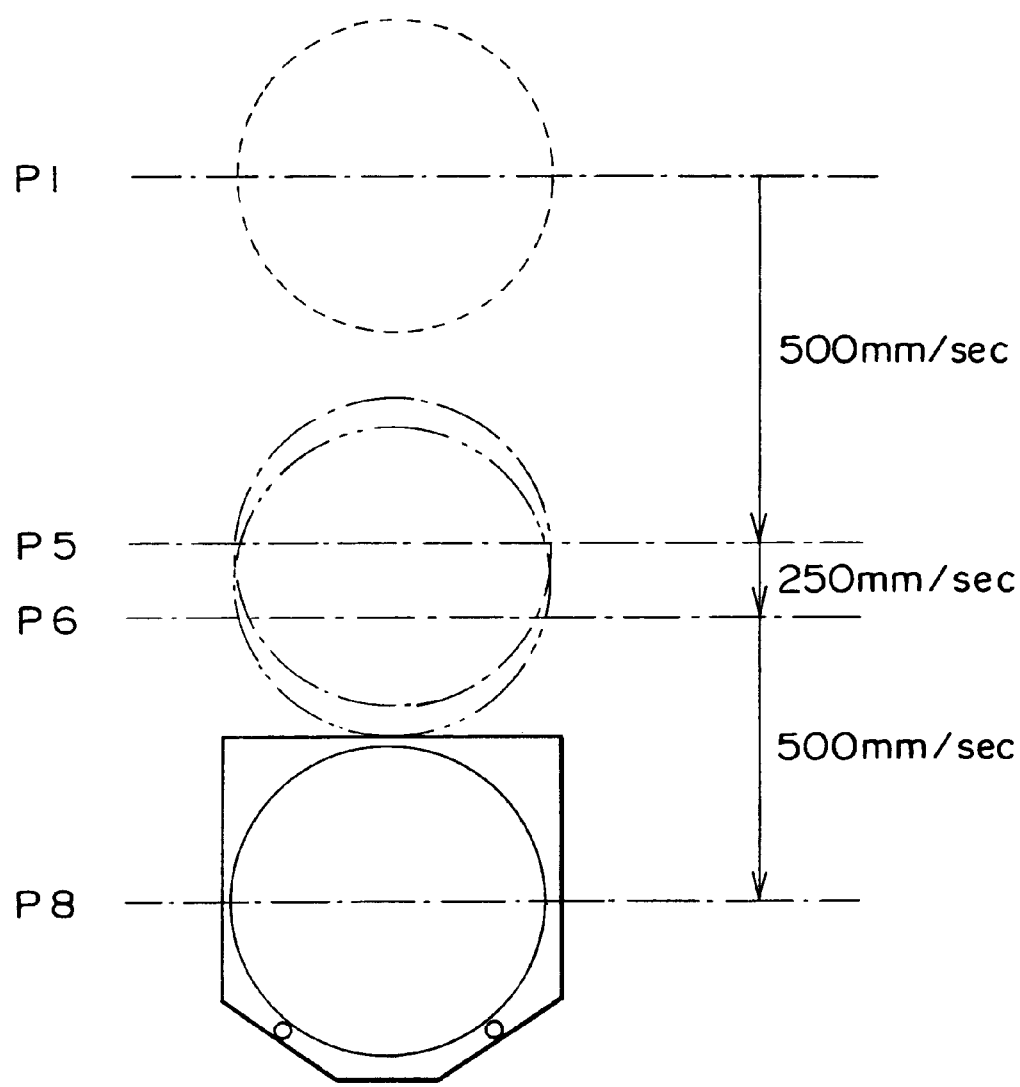
FIG. 12 is a diagrammatic view explaining an experimental procedure for examining the number of particles adhering to a wafer processed by the substrate processing apparatus in the second embodiment.
Figure 15:
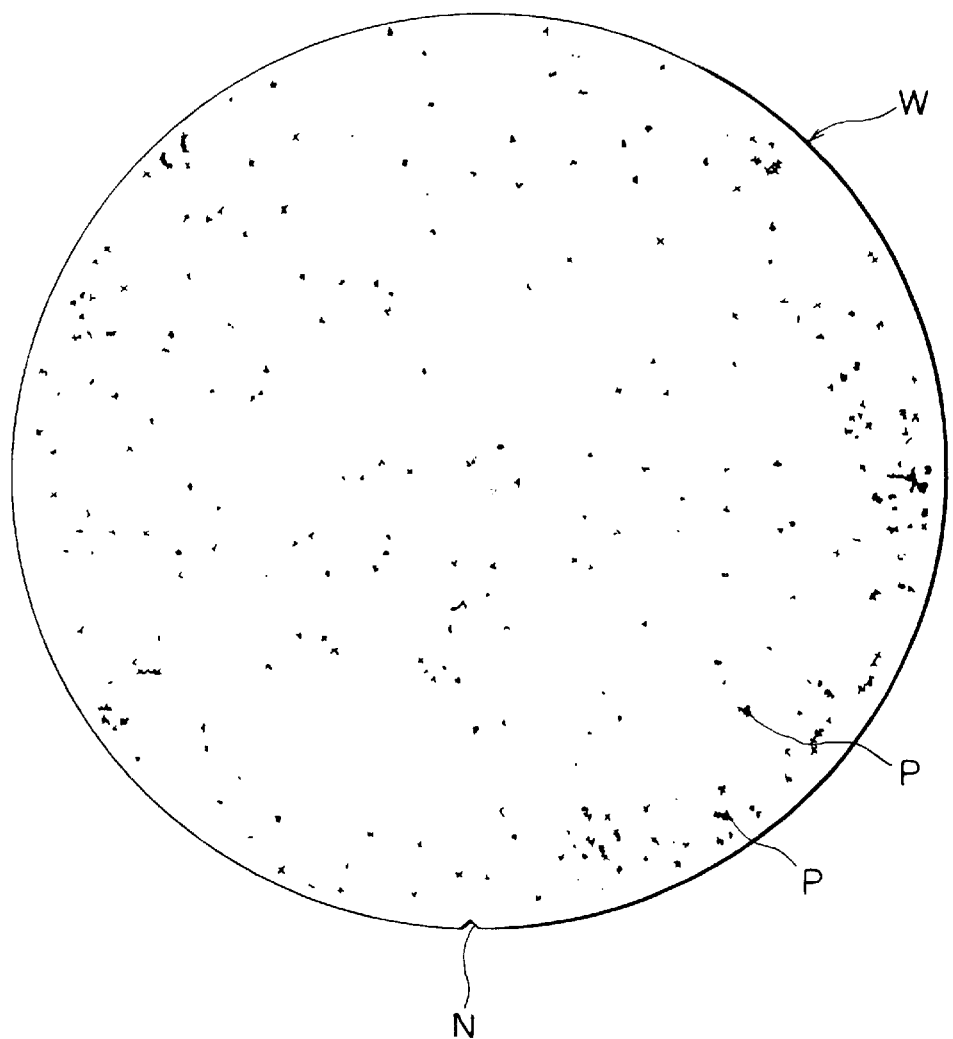
FIG. 15 is a plan view showing the adhesion of particles to a wafer before the wafer is cleaned.

As shown in FIG. 12, the wafers WE in Example 1 were immersed in 25° C. dilute hydrogen fluoride solution (DHF: 1:50), were moved from a position P1 to a position P5 at a speed of 500 mm/sec, the wafers WE were moved from the position P5 to a position P6 at a speed of 250 mm/sec, the lower parts of the wafers WE were immersed in pure water for 0.5 sec to remove particles adhering to the lower parts of the wafers WE, and then the wafers WE were moved from the position P6 to P8 at a speed of 500 mm/sec to immerse the wafers WE in pure water. The counted numbers of particles are tabulated in Table 2. FIG. 15 shows particles adhering to the wafer WE before cleaning, and FIG. 16 shows particles adhering to the wafer WE after cleaning.

TABLE 2

| PARTICLE SIZE ($\mu$M) | NUMBER OF PARTICLES (COMPARATIVE EXAMPLE) | | |
|---|---|---|---|
| | BEFORE CLEANING | AFTER CLEANING | DIFFERENCE |
| 0.16–0.20 | 127 | 157 | 30 |
| 0.20–0.25 | 22 | 44 | 22 |
| 0.25–0.30 | 15 | 27 | 12 |
| 0.30–0.50 | 14 | 27 | 13 |
| 0.50–1.00 | 10 | 17 | 7 |
| 1.00– | 15 | 28 | 13 |
| TOTAL | 203 | 300 | 97 |

The total number of particles on the wafer WC in Comparative Example 1 was 46 before cleaning and increased by 691 to 737 after cleaning (about 1.5 times the number of particles before cleaning). On the other hand, the total number of particles on the wafer WE in Example 1 was 203 before cleaning and increased by only 97 to 300 after cleaning (about 0.48 times the number of particles before cleaning). It is known from the results of the experiment that the increase of the number of particles adhering to the wafer after cleaning can be effectively reduced by immersing the wafer in pure water after removing particles adhering to the wafer by immersing the lower part of the wafer for 0.5 sec in pure water.

Experiment 2

Experiments were conducted to examine the effect of ejecting a clean gas on wafers on depth of etch by a chemical liquid remaining on the wafers processed with the chemical liquid. Nitrogen gas was ejected on wafers WE in Example 2 coated with films and processed by the chemical liquid by the wafer processing apparatus in the fourth embodiment. Any clean gas was not ejected on wafers WC in Comparative Example 2 coated with the same films and processed by the same chemical liquid.

Figure 17:
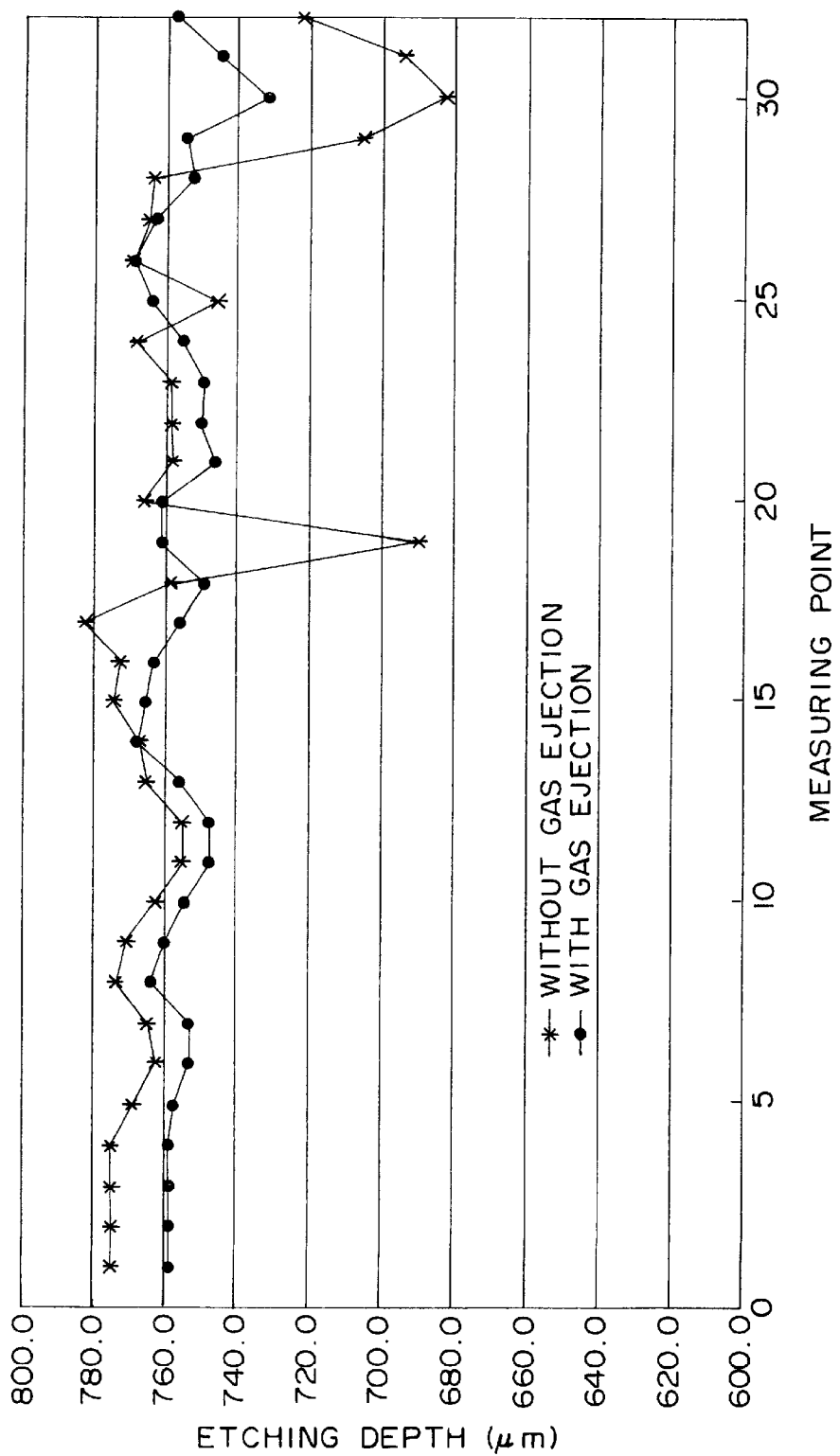
FIG. 17 is a graph showing the effect on etching uniformity of blowing $N_2$ gas upward from below wafers after processing the wafers with a chemical liquid.
Figure 18A:
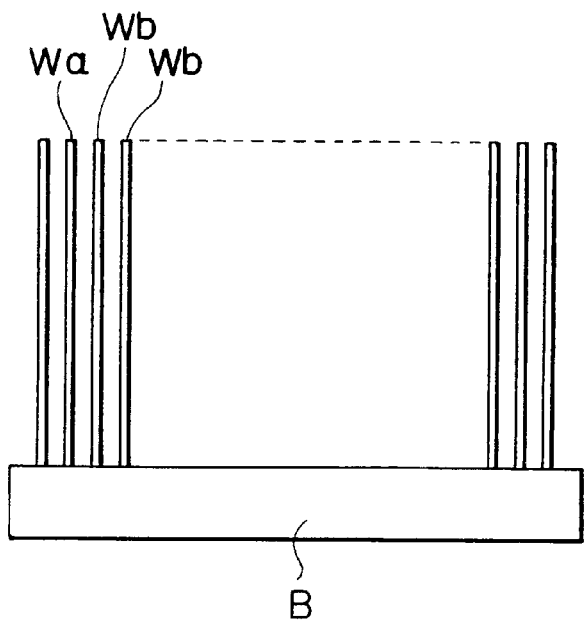
FIG. 18A is a schematic side view of an arrangement of silicon wafers coated with an oxide film and bare silicon wafers for experiments for examining the adhesion of a processing liquid and particles to the silicon wafers.
Figures 18B, 18C:
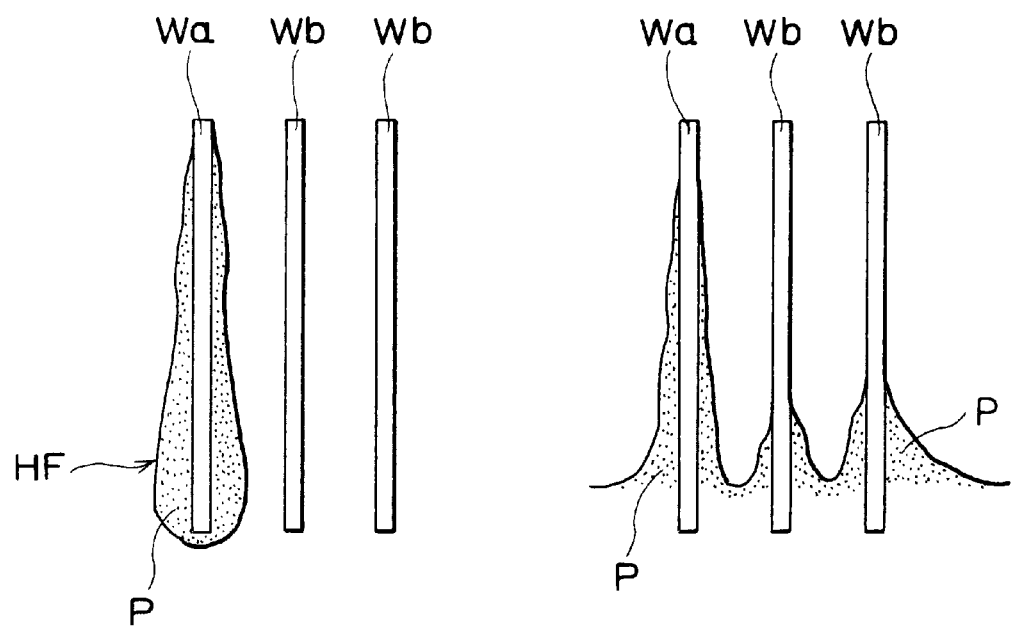
FIG. 18B is a schematic sectional view of wafers, a processing liquid remaining on one of the wafers and particles contained in the processing liquid remaining on the wafer.
FIG. 18C is a schematic sectional view of wafers and particles adhering to the wafers.
Figures 19A, 19B:
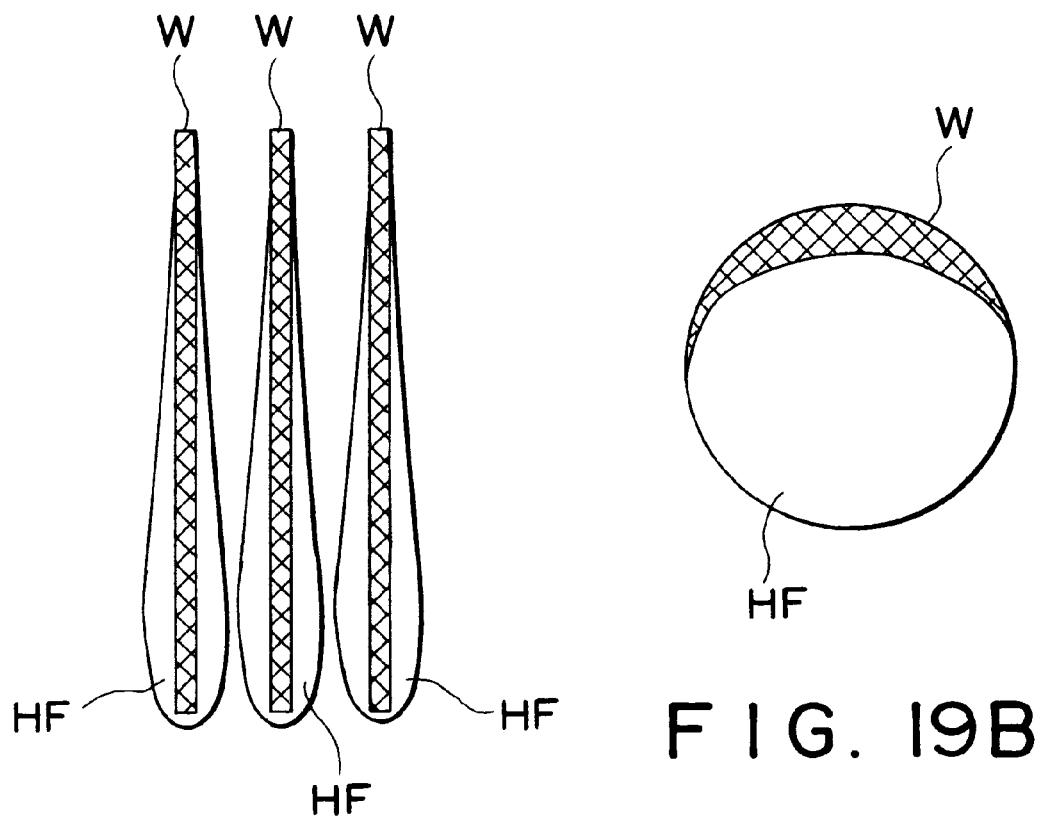
FIG. 19A is a schematic sectional view of wafers processed with a chemical liquid and wetted with the chemical liquid.
FIG. 19B is a schematic front view indicating a downward flow of a chemical liquid remaining on a wafer.

The wafers WC in Comparative Example 2 were prepared by immersing fifty wafers W coated with films in a dilute hydrogen fluoride solution (DHF: 1:50) for 1 min, rinsing the processed wafers W in ultrapure water for 5.5 min, and then drying the rinsed wafers W for 9 min. The twenty-sixth wafer WC was subjected to etching depth measurement. Values of the etching depth were determined by measuring the thickness of the film at measuring points before processing and after processing. Measured values of the etching depth are shown in Table 3 and FIG. 17.

TABLE 3

| MEA-SURING POINT | COORDINATES | | BEFORE PRO-CESSING | AFTER PRO-CESSING | DIFFER-ENCE |
|---|---|---|---|---|---|
| | X | Y | | | |
| 1 | 0 | 0 | 997.89 | 223.18 | 774.7 |
| 2 | 0 | 0 | 997.87 | 223.13 | 774.7 |
| 3 | 0 | 0 | 997.96 | 223.1 | 774.9 |
| 4 | 0 | 0 | 997.93 | 223.13 | 774.8 |
| 5 | 50 | 0 | 997.95 | 229.28 | 768.7 |
| 6 | 0 | 50 | 997.49 | 235.71 | 761.8 |
| 7 | −50 | 0 | 997.67 | 233.16 | 764.5 |
| 8 | 0 | −50 | 998.27 | 224.85 | 773.4 |
| 9 | 100 | 0 | 997.71 | 226.93 | 770.8 |
| 10 | 70.711 | 70.711 | 997.54 | 234.94 | 762.6 |
| 11 | 0 | 100 | 998.18 | 243.21 | 755.0 |
| 12 | −70.711 | 70.711 | 997.52 | 241.79 | 755.7 |
| 13 | −100 | 0 | 998.48 | 233.37 | 765.1 |
| 14 | −70.711 | −70.711 | 997.84 | 230.97 | 766.9 |
| 15 | 0 | −100 | 998.82 | 224.08 | 774.7 |
| 16 | 70.711 | −70.711 | 998.88 | 225.91 | 773.0 |
| 17 | 145 | 0 | 998.06 | 215.73 | 782.3 |
| 18 | 133.96 | 55.49 | 996.41 | 236.87 | 759.5 |
| 19 | 102.53 | 102.53 | 995.89 | 306 | 689.9 |
| 20 | 55.49 | 133.96 | 997.02 | 230.15 | 766.9 |
| 21 | 0 | 145 | 996.8 | 237.97 | 758.8 |
| 22 | −55.49 | 133.96 | 996.76 | 237.33 | 759.4 |
| 23 | −102.531 | 102.53 | 997.47 | 237.4 | 760.1 |
| 24 | −133.96 | 55.49 | 997.57 | 228.73 | 768.8 |
| 25 | −145 | 0 | 1039.2 | 293.49 | 745.7 |
| 26 | −133.96 | −55.49 | 997.58 | 227.47 | 770.1 |
| 27 | −102.53 | −102.531 | 994.79 | 230.04 | 764.8 |
| 28 | −55.49 | −133.96 | 995.69 | 231.53 | 764.2 |
| 29 | 0 | −145 | 1005.5 | 299.32 | 706.2 |
| 30 | 55.49 | −133.96 | 1030 | 347.36 | 682.6 |
| 31 | 102.531 | −102.53 | 1005.2 | 310.68 | 694.5 |
| 32 | 133.96 | −55.49 | 998.08 | 274.53 | 723.6 |
| Average Etching Depth | | | | | 755.9 |
| Maximum Etching Depth | | | | | 782.3 |
| Minimum Etching Depth | | | | | 682.6 |
| Range of etching depth variation | | | | | 99.7 |
| Standard Deviation (sigma) | | | | | 26.4 |
| Range/2Average | | | | | 6.6 |
| Sigma/Average | | | | | 3.5 |

The wafers WE in Example 2 were prepared by immersing fifty wafers W coated with films in a dilute hydrogen fluoride solution (DHF: 1:50) for 5 min or in a dilute hydrogen fluoride solution (DHF: 5:1) for 1 min, rinsing the processed wafers W in ultrapure water for 5.5 min, and then drying the rinsed wafers W for 9 min. Nitrogen gas was ejected on the wafers W while the wafers W were being carried to the cleaning tank. The twenty-sixth wafer WE was subjected to etching depth measurement. Values of the etching depth were determined by measuring the thickness of the film at measuring points before processing and after processing. Measured values of the etching depth are shown in Table 4 and FIG. 17.

TABLE 4

| MEA-SURING POINT | COORDINATES | | BEFORE PRO-CESSING | AFTER PRO-CESSING | DIFFER-ENCE |
|---|---|---|---|---|---|
| | X | Y | | | |
| 1 | 0 | 0 | 994.15 | 235.57 | 758.6 |
| 2 | 0 | 0 | 994 | 235.58 | 758.4 |
| 3 | 0 | 0 | 994.23 | 235.54 | 758.7 |
| 4 | 0 | 0 | 994.07 | 235.59 | 758.5 |
| 5 | 50 | 0 | 995.51 | 238.55 | 757.0 |
| 6 | 0 | 50 | 994.73 | 242.36 | 752.4 |
| 7 | −50 | 0 | 994.42 | 241.38 | 753.0 |
| 8 | 0 | −50 | 994.61 | 230.75 | 763.9 |
| 9 | 100 | 0 | 995.87 | 235.99 | 759.9 |
| 10 | 70.711 | 70.711 | 996.53 | 242.18 | 754.4 |
| 11 | 0 | 100 | 996.32 | 249.19 | 747.1 |
| 12 | −70.711 | 70.711 | 995.84 | 248.41 | 747.4 |
| 13 | −100 | 0 | 996.21 | 240.41 | 755.8 |
| 14 | −70.711 | −70.711 | 996.13 | 228.82 | 767.3 |
| 15 | 0 | −100 | 996.12 | 230.84 | 765.3 |
| 16 | 70.711 | −70.711 | 996.72 | 233.33 | 763.4 |
| 17 | 145 | 0 | 997.76 | 241.46 | 756.3 |
| 18 | 133.96 | 55.49 | 1027.2 | 278.12 | 749.1 |
| 19 | 102.53 | 102.53 | 998.65 | 237.46 | 761.2 |
| 20 | 55.49 | 133.96 | 996.19 | 234.62 | 761.6 |
| 21 | 0 | 145 | 992.57 | 246.31 | 746.3 |
| 22 | −55.49 | 133.96 | 994.14 | 243.65 | 750.5 |
| 23 | −102.531 | 102.53 | 994.97 | 245.56 | 749.4 |
| 24 | −133.96 | 55.49 | 996.07 | 240.63 | 755.4 |
| 25 | −145 | 0 | 996.77 | 232.69 | 764.1 |
| 26 | −133.96 | −55.49 | 999.71 | 230.26 | 769.5 |
| 27 | −102.53 | −102.531 | 996.45 | 233.21 | 763.2 |
| 28 | −55.49 | −133.96 | 996.26 | 243.45 | 752.8 |
| 29 | 0 | −145 | 1005.1 | 250.39 | 754.7 |
| 30 | 55.49 | −133.96 | 1047.3 | 315.2 | 732.1 |
| 31 | 102.531 | −102.53 | 1013.5 | 268.21 | 745.3 |
| 32 | 133.96 | −55.49 | 995.64 | 237.14 | 758.5 |
| Average Etching Depth | | | | | 756.0 |
| Maximum Etching Depth | | | | | 769.5 |
| Minimum Etching Depth | | | | | 732.1 |
| Range of etching depth variation | | | | | 37.4 |
| Standard Deviation (sigma) | | | | | 7.7 |
| Range/2Average | | | | | 2.5 |
| Sigma/Average | | | | | 1.0 |

Results of the experiments proved that the etching uniformity can be improved by ejecting nitrogen gas upward from below the wafers W after the wafers W have been processed by a chemical liquid.

According to an aspect of the present invention, dust contained in the processing liquid remaining on the surfaces of substrates can be removed in a process of processing the substrates held in a vertical attitude by immersing the same in a processing liquid and immersing the same in a cleaning liquid, by cleaning the lower parts of the substrates with a cleaning liquid either before the substrates are immersed in the processing liquid or the cleaning liquid or after the same have been taken out from the processing liquid or the cleaning liquid. Accordingly, the reattachment of particles to the substrates can be prevented and the yield of products can be improved.

According to another aspect of the present invention, the downward flow of the processing liquid along the substrates after the substrates have been processed with the processing liquid can be prevented in a process of processing the substrates held in a vertical attitude by bringing the same into contact with a processing liquid and bringing the same into contact with a cleaning liquid, by processing the substrates in an atmosphere in which a clean gas flows down, and reducing or stopping the flow of the clean gas when carrying the substrates processed with the processing liquid to the next processing unit using another processing liquid or the cleaning liquid. Thus, the etching uniformity of the substrates etched with the processing liquid can be improved and the yield of products can be improved.

According to a further aspect of the present invention, the downward flow of the processing liquid along the substrates after the wafers have been processed with the processing liquid can be prevented in a process of processing the substrates held in a vertical attitude by bringing the same into contact with a processing liquid and bringing the same into contact with a cleaning liquid, by blowing a clean gas upward from below the substrates while the substrates are being carried to the next processing unit using another processing liquid or the cleaning liquid. Thus, the etching uniformity of the substrates etched with the processing liquid can be improved and the yield of products can be improved.

What is claimed is:

1. A substrate processing apparatus comprising:
   a processing tank containing a processing liquid in which substrates are to be immersed;
   a cleaning tank containing a cleaning liquid in which the substrates are to be immersed;
   a substrate holding means for holding the substrates in a vertical attitude;
   lifting means for effecting downward and upward movements of the substrate holding means holding the substrates into and out of either the processing tank or the cleaning tank to immerse the substrates in either the processing liquid or the cleaning liquid, respectively, and to raise the substrates out of either the processing liquid or the cleaning liquid; and
   vertical movement control means for controlling said lifting means to temporarily stop the lifting means, during said downward movement of the substrates into said cleaning tank, in a state in which lower portions of the substrates held by said substrates holding means are immersed in an upper level portion of the cleaning liquid in the cleaning tank, and then to operate the lifting means to downwardly move the substrate holding means and the substrates held thereby into the cleaning liquid.

2. The substrate processing apparatus according to claim 1, wherein the cleaning tank is an overflow tank constantly producing an overflow of the cleaning liquid.

3. The substrate processing apparatus according to claim 1, wherein said vertical movement control means includes a controller for controlling said lifting means to stop the lifting means in a state in which a lower portion of said substrate holding means is immersed in said upper level portion of the cleaning liquid.

4. The substrate processing apparatus according to claim 1, wherein said vertical movement control means includes a controller for controlling said lifting means to move down the substrate holding means into the cleaning liquid, thus immersing the substrate in the cleaning liquid, after the lifting means is stopped.

5. A substrate processing apparatus comprising:
   a processing tank containing a processing liquid in which substrates are to be immersed;
   a cleaning tank containing a cleaning liquid in which the substrates are to be immersed;
   a substrate holding means for holding the substrates in a vertical attitude, said substrate holding means having lower holding bars for supporting lower edges of the substrates;
   lifting means for effecting downward and upward movements of the substrate holding means holding the substrates into and out of either the processing tank or the cleaning tank to immerse the substrates in either the processing liquid or the cleaning liquid, respectively, and to raise the substrates out of either the processing liquid or the cleaning liquid; and
   vertical movement control means for controlling said lifting means to temporarily stop the lifting means, during said downward movement of the substrates into said cleaning tank, in a state in which said lower holding bars of the substrate holding means and lower portions of the substrates held by said substrates holding means are immersed in an upper level portion of the cleaning liquid in the cleaning tank and then to operate the lifting means to downwardly move the substrate holding means and the substrates held thereby into the cleaning liquid.

6. The substrate processing apparatus according to claim 5, wherein the cleaning tank is an overflow tank constantly producing an overflow of the cleaning liquid.

7. A substrate processing apparatus comprising:
   a processing tank containing a processing liquid in which substrates are to be immersed;
   a cleaning tank containing a cleaning liquid in which the substrates are to be immersed;
   a substrate holding means for holding the substrates in a vertical attitude;
   lifting means for effecting downward and upward movements of the substrate holding means holding the substrates into and out of either the processing tank or the cleaning tank to immerse the substrates in either the processing liquid or the cleaning liquid, respectively, and to raise the substrates out of either the processing liquid or the cleaning liquid; and
   vertical movement control means for controlling said lifting means to move the lifting means so as to cause the substrate holding means holding the substrates into and out of the processing tank to immerse the substrates in the processing liquid, and then to move the lifting means so as to cause the substrate holding means holding the substrates into and out of the cleaning tank to immerse the substrates in the cleaning liquid, said vertical movement control means being operative to control said lifting means to temporarily stop the lifting means, during said downward movement of the substrates into said cleaning tank, in a state in which lower portions of the substrates held by said substrates holding means are immersed in an upper level portion of the cleaning liquid in the cleaning tank, and then to operate the lifting means to downwardly move the substrate holding means and the substrates held thereby into the cleaning liquid.

8. The substrate processing apparatus according to claim 7, wherein the cleaning tank is an overflow tank constantly producing an overflow of the cleaning liquid.

* * * * *